(12) United States Patent
Chono

(10) Patent No.: US 9,240,802 B2
(45) Date of Patent: Jan. 19, 2016

(54) INVERSE QUANTIZATION METHOD, INVERSE QUANTIZATION DEVICE, AND PROGRAM

(75) Inventor: Keiichi Chono, Tokyo (JP)

(73) Assignee: NEC CORPORATION, Tokyo (JP)

( * ) Notice: Subject to any disclaimer, the term of this patent is extended or adjusted under 35 U.S.C. 154(b) by 607 days.

(21) Appl. No.: 13/142,303

(22) PCT Filed: Dec. 22, 2009

(86) PCT No.: PCT/JP2009/071303
§ 371 (c)(1),
(2), (4) Date: Jun. 27, 2011

(87) PCT Pub. No.: WO2010/074068
PCT Pub. Date: Jul. 1, 2010

(65) Prior Publication Data
US 2011/0268184 A1    Nov. 3, 2011

(30) Foreign Application Priority Data
Dec. 26, 2008    (JP) .................................. 2008-332009

(51) Int. Cl.
| H04N 19/124 | (2014.01) |
| H03M 7/30 | (2006.01) |
| H04N 19/169 | (2014.01) |
| H04N 19/126 | (2014.01) |
| H04N 19/30 | (2014.01) |

(52) U.S. Cl.
CPC ........... *H03M 7/3082* (2013.01); *H04N 19/126* (2014.11); *H04N 19/169* (2014.11); *H04N 19/395* (2014.11)

(58) Field of Classification Search
None
See application file for complete search history.

(56) References Cited

U.S. PATENT DOCUMENTS

| 5,534,925 | A | * | 7/1996 | Zhong | .................... H04N 19/63 348/384.1 |
| 2006/0215917 | A1 | | 9/2006 | Kimura | |
| 2008/0112632 | A1 | * | 5/2008 | Vos | ..................... G10L 19/0017 382/248 |
| 2008/0198926 | A1 | * | 8/2008 | Bordes | ................. H04N 19/619 375/240.03 |

FOREIGN PATENT DOCUMENTS

| CN | 1838776 A | 9/2006 |
| JP | 2005124145 A | 5/2005 |
| JP | 2007142823 A | 6/2007 |

OTHER PUBLICATIONS

Chinese Office Action for CN 200980152585.6 issued on Mar. 5, 2013 with English Translation.
International Search Report for PCT/JP2009/071303 mailed Mar. 30, 2010.

(Continued)

*Primary Examiner* — Sath V Perungavoor
*Assistant Examiner* — Clifford Hilaire

(57) ABSTRACT

Disclosed is an inverse quantization method that reverse-quantizes multiple quantized values as a set, obtaining a set of multiple inverse quantized values, said method being characterized in that the range of potential inverse quantized values for each quantized value is obtained using at least a signal other than that of the aforementioned quantized value, and in that the set of preliminary inverse quantized values for which the total variation norm is the minimum within the range of potential values for each inverse quantized value is obtained as the aforementioned set of reverse-quantized values.

11 Claims, 11 Drawing Sheets

(56) References Cited

OTHER PUBLICATIONS

A. Aaron et al., "Wyner-Ziv Coding for Motion Video", Asilomar Conference, Nov. 2002.
Y. Vatis et al., "Enhanced reconstruction of the quantised transform coefficients for Wyner-Ziv coding", ICME, Jul. 2007.
D. Kubasov et al., "Optimal Reconstruction in Wyner-Ziv Video Coding with Multiple Side Information", MMSP, Oct. 2007.
L. I. Rudin et al., "Nonlinear total variation based noise removal algorithms", Physica D, vol. 60, 1992, pp. 259-268.
C. Tomasi et al., "Bilateral Filtering for Gray and Color Images", Proceedings of the 1998 IEEE International Conference on Computer Vision, 1998.
F. Alter et al , "Adapted Total Variation for Artifact Free Decompression of JPEG Images", Journal of Mathematical Imaging and Vision 23, 2005, pp. 199-211.
A. Chambolle, "An algorithm for total variation minimization and applications" Journal of Mathematical Imaging and Vision, vol. 20, No. 1, 2004, pp. 89-97.
J. R. Price et al "Biased reconstruction for JPEG decoding", IEEE Signal Processing Letters, vol. 6, No. 12, Dec. 1999, pp. 297-299.

* cited by examiner

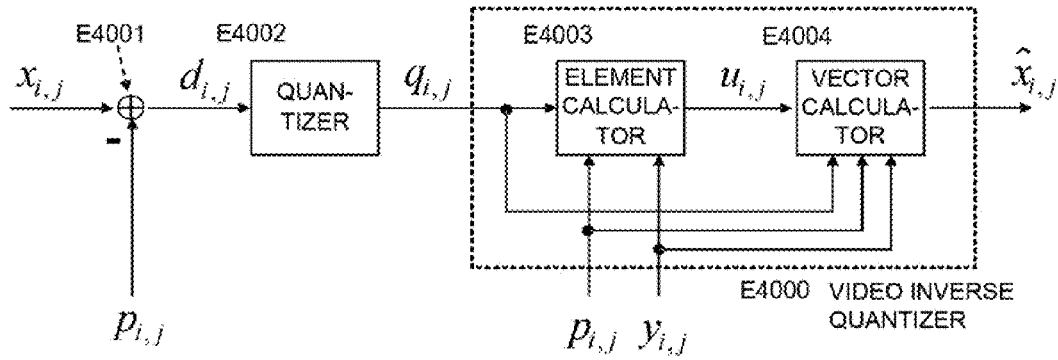
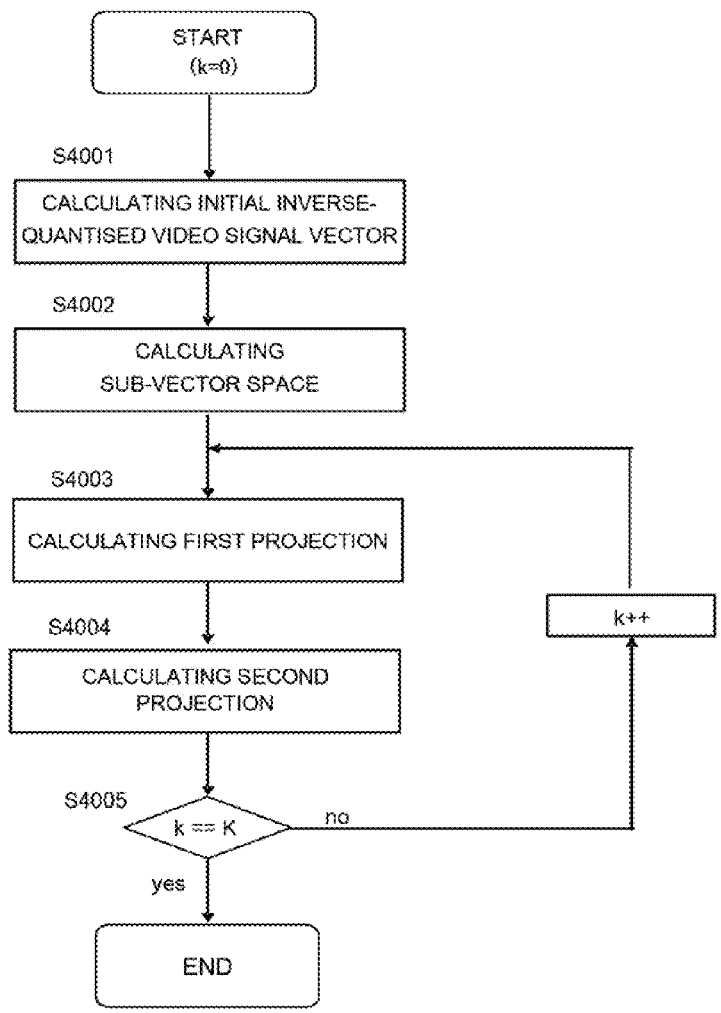

INVERSE QUANTIZATION METHOD, INVERSE QUANTIZATION DEVICE, AND PROGRAM

This application is the National Phase of PCT/JP2009/071303, filed Dec. 22, 2009, which is based upon and claims the benefit of priority from Japanese patent application No. 2008-332009, filed on Dec. 26, 2008, the disclosure of which is incorporated herein in its entirety by reference.

TECHNICAL FIELD

The present invention relates to an inverse quantization method, an inverse quantization device, a program therefor.

BACKGROUND ART

The related video inverse quantization technology will be explained by making a reference to FIG. 1. However, an attention should be paid to the fact that a quantizer E1001 is shown for a purpose of indicating an input/output relation with an element calculator E1002 for performing a video inverse quantization, namely to the fact that the video inverse quantization technology can be configured only of the element calculator E1002.

Further, it is assumed that one piece of a video frame having a gray scale with m vertical pixels and n horizontal pixels is a video signal vector x. However, the prior arts and the present invention are applicable for color video signals as well, as apparent from the explanation that will be later made. Further, the prior arts and the present invention are applicable even though the aforementioned video signal vector x is a sub-region of the video frame. Additionally, in this paper, "a set of a plurality of elements" and "an aggregation of a plurality of elements" are referred to as "a vector".

The quantizer E1001 quantizes each element $$x_{i,j}(0 \leq i \leq m-1, 0 \leq j \leq n-1)$$

of the video signal vector x, and calculates a quantized value $q_{i,j}$. Upon assuming the quantizer of E1001 to be a linear quantizer of which a quantization width is $Q_s$, $$q_{i,j} = \text{floor}(x_{i,j}/Q_s + 0.5) \quad (1)$$

is yielded. Where function floor( ), which is a floor function, is a function for returning a maximum integer, out of input values, being real number values. Hereafter, it is assumed that a set (an aggregation) of the aforementioned quantized values $q_{i,j}$ is a quantized value vector q.

The element calculator E1002 calculates an inverse-quantized value $$\hat{x}_{i,j}$$

by employing the aforementioned quantized value $q_{i,j}$, and each element $y_{i,j}$ of another video signal vector y (auxiliary information y) having a correlation with the video signal vector x. Upon assuming a half-open interval corresponding to the aforementioned quantized value $q_{i,j}$ to be $$[Q_{i,j}^-, Q_{i,j}^+) \text{ (however, } Q_{i,j}^- = Q_s \cdot q_{i,j} - Q_s/2, Q_{i,j}^+ = Q_s \cdot q_{i,j} + Q_s/2)$$

and a conditional provability density function corresponding to the aforementioned correlation to be $f_{X|Y}(x|y)$, the element calculator E1002 calculates each element (each inverse-quantized value)

$$\hat{x}_{i,j}$$

for which the minimum mean square error of the inverse-quantized video signal vector $$\hat{x},$$

being the video signal vector that has been inverse-quantized, becomes minimized with the following conditional expectation value (FIG. 2).

$$\hat{x}_{i,j} = E_{X|y}[x|x \in [Q_{i,j}^-, Q_{i,j}^+), y_{i,j}] = \int_{Q_{i,j}^-}^{Q_{i,j}^+} x \cdot f_{X|y}(x|y_{i,j}) dx \quad (2)$$

Additionally, as a matter of fact, the approximate calculations (Non-patent literature 1, 2, and 3) that are replaced with the numerical expression (2) are utilized for the reason that a complete form of "conditional provability distribution $f_{X|Y}$ is unknown", and that "the calculation of the numerical expression (2) requires integral calculation". For example, the Non-patent Literature 1 proposes to utilize the following numerical expression (2)' instead of the numerical expression (2).

$$\hat{x}_{i,j} = \begin{cases} Q_{i,j}^-, & y_{i,j} < Q_{i,j}^- \\ y_{i,j}, & Q_{i,j}^- \leq y_{i,j} < Q_{i,j}^+ \\ Q_{i,j}^+, & Q_{i,j}^+ \leq y_{i,j} \end{cases} \quad (2)'$$

So long as the approximate calculations is exact, calculating the inverse-quantized values by utilizing the aforementioned auxiliary information y makes it possible to reduce the mean square error of the inverse-quantized video signal vector $$\hat{x}$$

all the more as compared with the case of calculating the inverse-quantized values by simply inverse-quantizing the video signal vector.

The aforementioned video inverse quantization of the element calculator E1002 enables the inverse-quantized video signal vector $$\hat{x}$$

of which the mean square error is smaller to be calculated.

Above, the explanation of the related arts is finished.

PRIOR ART LITERATURES

Non-Patent Literatures

NON-PTL 1: Aaron, R. Zhang and B. Girod, "Wyner-Ziv Coding for Motion Video," Asilomar Conference, November 2002.

NON-PTL 2: Y. Vatis, S. Klomp and J. Ostermann, "Enhanced reconstruction of the quantised transform coefficients for Wyner-Ziv coding," ICME, July 2007.

NON-PTL 3: D. Kubasov, J. Nayak and C. Guillemot, "Optimal Reconstruction in Wyner-Ziv Video Coding with Multiple Side Information," MMSP, October 2007.

NON-PTL 4: S. Osher, L. I. Rudin, and E. Fatemi, "Nonlinear total variation based noise removal algorithms," Physic D. vol. 60, pp. 259-268, 1992.

NON-PTL 5: C. Tomasi and R. Manduchi, "Bilateral Filtering for Gray and Color Images," ICCV, 1998.

NON-PTL 6: F. Alter, S. Durand and J. Froment, "Adapted Total Variation for Artifact Free Decompression of JPEG Images," Journal of Mathematical Imaging and Vision 23, pp. 199-211, September 2005.

NON-PTL 7: A. Chambolle, "An algorithm for total variation minimization and applications," J. Math. Imaging Vis., vol. 20, No. 1, pp. 89-97, 2004.

SUMMARY OF INVENTION

Technical Problem

As a basic problem of the related arts, there exists the problem that even though the approximation calculation is exact, the square error is locally enlarged in return for a reduction in the mean square error of the inverse-quantized video signal vector $\hat{x}$ and it is conspicuous as local deterioration.

Thereupon, the present invention has been accomplished in consideration of the above-mentioned problems, and an object thereof is to provide an inverse quantization method with a high quality, an inverse quantization device with a high quality, and a program therefor.

Solution to Problem

The present invention for solving the above-mentioned problems is an inverse quantization method of inverse-quantizing a plurality of quantized values as a set, and obtaining a set of a plurality of inverse-quantized values, comprising: obtaining a scope of potential inverse-quantized values for each quantized value by employing at least signals other than said quantized value; and obtaining a set of preliminary inverse-quantized values for which a total variation norm becomes minimized as said set of inverse-quantized values, within a scope of said potential inverse-quantized values.

The present invention for solving the above-mentioned problems is an inverse quantization method of inverse-quantizing a plurality of quantized values as a set, and obtaining a set of a plurality of inverse-quantized values, comprising: calculating a preliminary inverse-quantized value of each quantized value of said plurality of quantized values in an element unit by employing said plurality of quantized values, and signals other than said quantized value; and obtaining a scope of potential inverse-quantized values for each quantized value by employing said plurality of quantized values, and obtaining a set of the preliminary inverse-quantized values for which a total variation norm becomes minimized as said set of inverse-quantized values, within a scope of said potential inverse-quantized values with a set of the preliminary inverse-quantized values calculated in said element unit as a starting point.

The present invention for solving the above-mentioned problems is an encoding method of encoding a plurality of quantized values, employing an inverse quantization method of inverse-quantizing a plurality of quantized values as a set, and obtaining a set of a plurality of inverse-quantized values, wherein said inverse quantization method: obtains a scope of potential inverse-quantized values for each quantized value by employing at least signals other than of said quantized value; and obtains a set of preliminary inverse-quantized values for which a total variation norm becomes minimized as said set of inverse-quantized values, within a scope of said potential inverse-quantized values.

The present invention for solving the above-mentioned problems is an encoding method of encoding a plurality of quantized values, employing an inverse quantization method of inverse-quantizing a plurality of quantized values as a set, and obtaining a set of a plurality of inverse-quantized values, wherein said inverse quantization method: calculates a preliminary inverse-quantized value of each quantized value of said plurality of quantized values in an element unit by employing said plurality of quantized values and signals other than said quantized value; and obtains a scope of potential inverse-quantized values for each quantized value by employing said plurality of quantized values, and obtains a set of the preliminary inverse-quantized values for which a total variation norm becomes minimized as said set of inverse-quantized values, within a scope of said potential inverse-quantized values with a set of the preliminary inverse-quantized values calculated in said element unit as a starting point.

The present invention for solving the above-mentioned problems is a decoding method of decoding a plurality of quantized values, employing an inverse quantization method of inverse-quantizing a plurality of quantized values as a set, and obtaining a set of a plurality of inverse-quantized values, wherein said inverse quantization method: obtains a scope of potential inverse-quantized values for each quantized value by employing at least signals other than said quantized value; and obtains a set of preliminary inverse-quantized values for which a total variation norm becomes minimized as said set of inverse-quantized values, within a scope of said potential inverse-quantized values.

The present invention for solving the above-mentioned problems is a decoding method of decoding a plurality of quantized values, employing an inverse quantization method of inverse-quantizing a plurality of quantized values as a set, and obtaining a set of a plurality of inverse-quantized values, wherein said inverse quantization method: calculates a preliminary inverse-quantized value of each quantized value of said plurality of quantized values in an element unit by employing said plurality of quantized values and signals other than said quantized value; and obtains a scope of potential inverse-quantized values for each quantized value by employing said plurality of quantized values, and obtains a set of the preliminary inverse-quantized values for which a total variation norm becomes minimized as said set of inverse-quantized values, within a scope of said potential inverse-quantized values with a set of the preliminary inverse-quantized values calculated in said element unit as a starting point.

The present invention for solving the above-mentioned problems is a video inverse quantization method of, from a quantized value vector corresponding to a video vector, being a current target of processing, calculating an inverse-quantized video vector thereof, comprising: a video element calculation step of calculating an initial inverse-quantized video vector in an element unit by employing an element of another video vector having a correlation with the video vector, being said target of processing, and an element of said quantized value vector; and a video vector calculation step of, as said inverse-quantized video vector, calculating a preliminary inverse-quantized video vector for which a total variation norm becomes minimized from an aggregation of preliminary inverse-quantized video vectors that are decided by another video vector having a correlation with the video vector, being said target of processing, and said quantized value vector with the initial inverse-quantized video vector calculated by said video element calculation step as a starting point.

The present invention for solving the above-mentioned problems is a video inverse quantization method of, from a quantized value vector corresponding to a video vector, being a current target of processing, calculating an inverse-quantized video vector thereof, comprising: a video element calculation step of calculating an initial inverse-quantized video vector in an element unit by employing an element of another video vector having a correlation with the video vector, being said target of processing, and an element of said quantized value vector; and a video vector calculation step of, as said inverse-quantized video vector, calculating a preliminary inverse-quantized video vector for which a total variation norm becomes minimized from an aggregation of preliminary inverse-quantized video vectors that are decided by said quantized value vector with the initial inverse-quantized video vector calculated by said video element calculation step as a starting point.

The present invention for solving the above-mentioned problems is a video inverse quantization method of, from a quantized value vector corresponding to a video vector, being a current target of processing, calculating an inverse-quantized video vector thereof, comprising:

a video element calculation step of calculating an initial inverse-quantized video vector in an element unit by employing an element of said quantized value vector; and a video vector calculation step of, as said inverse-quantized video vector, calculating a preliminary inverse-quantized video vector for which a total variation norm becomes minimized from an aggregation of preliminary inverse-quantized video vectors that are decided by another video vector having a correlation with the video vector, being said target of processing, and said quantized value vector with the initial inverse-quantized video vector calculated by said video element calculation step as a starting point.

The present invention for solving the above-mentioned problems is a video encoding method of encoding a quantized value vector, employing a video inverse quantization method of, from a quantized value vector corresponding to a video vector, being a current target of processing, calculating an inverse-quantized video vector thereof, wherein said video inverse quantization method comprises: a video element calculation step of calculating an initial inverse-quantized video vector, being a target of processing, in an element unit by employing an element of another video vector having a correlation with the video vector, being said target of processing, and an element of said quantized value vector; and a video vector calculation step of, as said inverse-quantized video vector, calculating a preliminary inverse-quantized video vector for which a total variation norm becomes minimized from a vector space that is decided by another video vector having a correlation with the video vector, being said target of processing, and said quantized value vector with the initial inverse-quantized video vector calculated by said video element calculation step as a starting point.

The present invention for solving the above-mentioned problems is a video decoding method of decoding a quantized value vector, employing a video inverse quantization method of, from a quantized value vector corresponding to a video vector, being a current target of processing, calculating an inverse-quantized video vector thereof, wherein said video inverse quantization method comprises: a video element calculation step of calculating an initial inverse-quantized video vector, being a target of processing, in an element unit by employing an element of another video vector having a correlation with the video vector, being said target of processing, and an element of said quantized value vector; and a video vector calculation step of, as said inverse-quantized video vector, calculating a preliminary inverse-quantized video vector for which a total variation norm becomes minimized from a vector space that is decided by another video vector having a correlation with the video vector, being said target of processing, and said quantized value vector with the initial inverse-quantized video vector calculated by said video element calculation step as a starting point.

The present invention for solving the above-mentioned problems is an inverse quantization device for inverse-quantizing a plurality of quantized values as a set, and obtaining a set of a plurality of inverse-quantized values, comprising a decoding means that obtains a scope of potential inverse-quantized values for each quantized value by employing at least signals other than said quantized value, and obtains a set of preliminary inverse-quantized values for which a total variation norm becomes minimized as said set of inverse-quantized values, within a scope of said potential inverse-quantized values.

The present invention for solving the above-mentioned problems is an inverse quantization device for inverse-quantizing a plurality of quantized values as a set, and obtaining a set of a plurality of inverse-quantized values, comprising a decoding means that calculates a preliminary inverse-quantized value of each quantized value of said plurality of quantized values in an element unit by employing said plurality of quantized values, and signals other than said quantized value, obtains a scope of potential inverse-quantized values for each quantized value by employing said plurality of quantized values, and obtains a set of the preliminary inverse-quantized values for which a total variation norm becomes minimized as said set of inverse-quantized values, within a scope of said potential inverse-quantized values with a set of the preliminary inverse-quantized values calculated in said element unit as a starting point.

The present invention for solving the above-mentioned problems is an encoding device for encoding a plurality of quantized values, comprising an inverse quantization device for inverse-quantizing a plurality of quantized values as a set, and obtaining a set of a plurality of inverse-quantized values, wherein said inverse quantization device comprises a means that obtains a scope of potential inverse-quantized values each quantized value by employing at least signals other than said quantized value, and obtains a set of preliminary inverse-quantized values for which a total variation norm becomes minimized as said set of inverse-quantized values, within a scope of said potential inverse-quantized values.

The present invention for solving the above-mentioned problems is an encoding device for encoding a plurality of quantized values, comprising an inverse quantization device for inverse-quantizing a plurality of quantized values as a set, and obtaining a set of a plurality of inverse-quantized values, wherein said inverse quantization device comprises a means that calculates a preliminary inverse-quantized value of each quantized value of said plurality of quantized values in an element unit by employing said plurality of quantized values and signals other than said quantized value, obtains a scope of potential inverse-quantized values for each quantized value by employing said plurality of quantized values, and obtains a set of the preliminary inverse-quantized values for which a total variation norm becomes minimized as said set of inverse-quantized values, within a scope of said potential inverse-quantized values with a set of the preliminary inverse-quantized values calculated in said element unit as a starting point.

The present invention for solving the above-mentioned problems is a decoding device for decoding a plurality of quantized values, comprising an inverse quantization device for inverse-quantizing a plurality of quantized values as a set, and obtaining a set of a plurality of inverse-quantized values, wherein said inverse quantization device comprises a means that obtains a scope of potential inverse-quantized values for each quantized value by employing at least signals other than said quantized value; and obtains a set of preliminary inverse-quantized values for which a total variation norm becomes minimized as said set of inverse-quantized values, within a scope of said potential inverse-quantized values.

The present invention for solving the above-mentioned problems is a decoding device for decoding a plurality of quantized values, comprising an inverse quantization device for inverse-quantizing a plurality of quantized values as a set, and obtaining a set of a plurality of inverse-quantized values, wherein said inverse quantization device comprises a means that calculates a preliminary inverse-quantized value of each quantized value of said plurality of quantized values in an element unit by employing said plurality of quantized values and signals other than said quantized value, obtains a scope of potential inverse-quantized values for each quantized value by employing said plurality of quantized values, and obtains a set of the preliminary inverse-quantized values for which a total variation norm becomes minimized as said set of inverse-quantized values, within a scope of said potential inverse-quantized values with a set of the preliminary inverse-quantized values calculated in said element unit as a starting point.

The present invention for solving the above-mentioned problems is a video inverse quantization device for, from a quantized value vector corresponding to a video vector, being a current target of processing, calculating an inverse-quantized video vector thereof, comprising: a video element calculation means that calculates an initial inverse-quantized video vector in an element unit by employing an element of another video vector having a correlation with the video vector, being said target of processing, and an element of said quantized value vector; and a video vector calculation means that calculates, as said inverse-quantized video vector, a preliminary inverse-quantized video vector for which a total variation norm becomes minimized from an aggregation of preliminary inverse-quantized video vectors that are decided by another video vector having a correlation the video vector, being said target of processing, and said quantized value vector with the initial inverse-quantized video vector calculated by said video element calculation means as a starting point.

The present invention for solving the above-mentioned problems is a video inverse quantization device for, from a quantized value vector corresponding to a video vector, being a current target of processing, calculating an inverse-quantized video vector thereof, comprising: a video element calculation means that calculates an initial inverse-quantized video vector in an element unit by employing an element of another video vector having a correlation with the video vector, being said target of processing, and an element of said quantized value vector; and a video vector calculation means that calculates, as said inverse-quantized video vector, a preliminary inverse-quantized video vector for which a total variation norm becomes minimized from an aggregation of preliminary inverse-quantized video vectors that are decided by said quantized value vector with the initial inverse-quantized video vector calculated by said video element calculation means as a starting point.

The present invention for solving the above-mentioned problems is a video inverse quantization device for, from a quantized value vector corresponding to a video vector, being a current target of processing, calculating an inverse-quantized video vector thereof, comprising: a video element calculation means that calculates an initial inverse-quantized video vector in an element unit by employing an element of said quantized value vector; and a video vector calculation means that calculates, as said inverse-quantized video vector, a preliminary inverse-quantized video vector for which a total variation norm becomes minimized from an aggregation of preliminary inverse-quantized video vectors that are decided by another video vector having a correlation with the video vector, being said target of processing, and said quantized value vector with the initial inverse-quantized video vector calculated by said video element calculation means as a starting point.

The present invention for solving the above-mentioned problems is a video encoding device for encoding a quantized value vector, comprising a video inverse quantization device for, from a quantized value vector corresponding to a video vector, being a current target of processing, calculating an inverse-quantized video vector thereof, wherein said video inverse quantization device comprises: a video element calculation means that calculates an initial inverse-quantized video vector, being a target of processing, in an element unit by employing an element of another video vector having a correlation with the video vector, being said target of processing, and an element of said quantized value vector; and a video vector calculation means that calculates, as said inverse-quantized video vector, a preliminary inverse-quantized video vector for which a total variation norm becomes minimized from a vector space that is decided by another video vector having a correlation with the video vector, being said target of processing, and said quantized value vector with the initial inverse-quantized video vector calculated by said video element calculation means as a starting point.

The present invention for solving the above-mentioned problems is a video decoding device for decoding a quantized value vector, comprising a video inverse quantization device for, from a quantized value vector corresponding to a video vector, being a current target of processing, calculating an inverse-quantized video vector thereof, wherein said video inverse quantization device comprises: a video element calculation means that calculates an initial inverse-quantized video vector, being a target of processing, in an element unit by employing an element of another video vector having a correlation with the video vector, being said target of processing, and an element of said quantized value vector; and a video vector calculation means that calculates, as said inverse-quantized video vector, a preliminary inverse-quantized video vector for which a total variation norm becomes minimized from a vector space that is decided by another video vector having a correlation with the video vector, being said target of processing, and said quantized value vector with the initial inverse-quantized video vector calculated by said video element calculation means as a starting point.

The present invention for solving the above-mentioned problems is an inverse quantization program for inverse-quantizing a plurality of quantized values as a set, and obtaining a set of a plurality of inverse-quantized values, causing an information processing device to execute: a process of obtaining a scope of potential inverse-quantized values for each quantized value by employing at least signals other than said quantized value; and a process of obtaining a set of preliminary inverse-quantized values for which a total variation norm becomes minimized as said set of inverse-quantized values, within a scope of said potential inverse-quantized values.

The present invention for solving the above-mentioned problems is an inverse quantization program for inverse-quantizing a plurality of quantized values as a set, and obtaining a set of a plurality of inverse-quantized values, causing an information processing device to execute: a process of calculating a preliminary inverse-quantized value of each quantized value of said plurality of quantized values in an element unit by employing said plurality of quantized values and signals other than said quantized value, and a process of obtaining a scope of potential inverse-quantized values for each quantized value by employing said plurality of quantized values, and obtaining a set of the preliminary inverse-quantized values for which a total variation norm becomes minimized as said set of inverse-quantized values, within a scope of said potential inverse-quantized values with a set of the preliminary inverse-quantized values calculated in said element unit as a starting point.

The present invention for solving the above-mentioned problems is an encoding program for encoding a plurality of quantized values, comprising an inverse quantization process of inverse-quantizing a plurality of quantized values as a set, and obtaining a set of a plurality of inverse-quantized values, wherein said inverse quantization process causes an information processing device to execute: a process of obtaining a scope of potential inverse-quantized values for each quantized value by employing at least signals other than said quantized value; and a process of obtaining a set of preliminary inverse-quantized values for which a total variation norm becomes minimized as said set of inverse-quantized values, within a scope of said potential inverse-quantized values.

The present invention for solving the above-mentioned problems is an encoding program for encoding a plurality of quantized values, comprising an inverse quantization process of inverse-quantizing a plurality of quantized values as a set, and obtaining a set of a plurality of inverse-quantized values, wherein said inverse quantization process causes an information processing device to execute: a process of calculating a preliminary inverse-quantized value of each quantized value of said plurality of quantized values in an element unit by employing said plurality of quantized values and signals other than said quantized value; and a process of obtaining a scope of potential inverse-quantized values for each quantized value by employing said plurality of quantized values, and obtaining a set of the preliminary inverse-quantized values for which a total variation norm becomes minimized as said set of inverse-quantized values, within a scope of said potential inverse-quantized values with a set of the preliminary inverse-quantized values calculated in said element unit as a starting point.

The present invention for solving the above-mentioned problems is a decoding program for decoding a plurality of quantized values, comprising an inverse quantization process of inverse-quantizing a plurality of quantized values as a set, and obtaining a set of a plurality of inverse-quantized values, wherein said inverse quantization process causes an information processing device to execute: a process of obtaining a scope of potential inverse-quantized values for each quantized value by employing at least signals other than said quantized value; and a process of obtaining a set of preliminary inverse-quantized values for which a total variation norm becomes minimized as said set of inverse-quantized values, within a scope of said potential inverse-quantized values.

The present invention for solving the above-mentioned problems is a decoding program for decoding a plurality of quantized values, comprising an inverse quantization process of inverse-quantizing a plurality of quantized values as a set, and obtaining a set of a plurality of inverse-quantized values, wherein said inverse quantization process causes an information processing device to execute: a process of calculating a preliminary inverse-quantized value of each quantized value of said plurality of quantized values in an element unit by employing said plurality of quantized values and signals other than said quantized values; and a process of obtaining a scope of potential inverse-quantized values for each quantized value by employing said plurality of quantized values, and obtaining a set of the preliminary inverse-quantized values for which a total variation norm becomes minimized as said set of inverse-quantized values, within a scope of said potential inverse-quantized values with a set of the preliminary inverse-quantized values calculated in said element unit as a starting point.

The present invention for solving the above-mentioned problems is a video inverse quantization program for, from a quantized value vector corresponding to a video vector, being a current target of processing, calculating an inverse-quantized video vector thereof, said video inverse quantization program causing an information processing device to execute: a video element calculation process of calculating an initial inverse-quantized video vector in an element unit by employing an element of another video vector having a correlation with the video vector, being said target of processing, and an element of said quantized value vector; and a video vector calculation process of, as said inverse-quantized video vector, calculating a preliminary inverse-quantized video vector for which a total variation norm becomes minimized from an aggregation of preliminary inverse-quantized video vectors that are decided by another video vector having a correlation with the video vector, being said target of processing, and said quantized value vector with the initial inverse-quantized video vector calculated by said video element calculation process as a starting point.

The present invention for solving the above-mentioned problems is a video inverse quantization program for, from a quantized value vector corresponding to a video vector, being a current target of processing, calculating an inverse-quantized video vector thereof, said video inverse quantization program causing an information processing device to execute: a video element calculation process of calculating an initial inverse-quantized video vector in an element unit by employing an element of another video vector having a correlation with the video vector, being said target of processing, and an element of said quantized value vector; and a video vector calculation process of, as said inverse-quantized video vector, calculating a preliminary inverse-quantized video vector for which a total variation norm becomes minimized from an aggregation of preliminary inverse-quantized video vectors that are decided by said quantized value vector with the initial inverse-quantized video vector calculated by said video element calculation process as a starting point.

The present invention for solving the above-mentioned problems is a video inverse quantization program for, from a quantized value vector corresponding to a video vector, being a current target of processing, calculating an inverse-quantized video vector thereof, said video inverse quantization program causing an information processing device to execute: a video element calculation process of calculating an initial inverse-quantized video vector in an element unit by employing an element of said quantized value vector; and a video vector calculation process of, as said inverse-quantized video vector, calculating a preliminary inverse-quantized video vector for which a total variation norm becomes minimized from an aggregation of preliminary inverse-quantized video vectors that are decided by another video vector having a correlation with the video vector, being said target of processing, and said quantized value vector with the initial inverse-quantized video vector calculated by said video element calculation process as a starting point.

The present invention for solving the above-mentioned problems is a video encoding program for encoding a quantized value vector, comprising a video inverse quantization process of, from a quantized value vector corresponding to a video vector, being a current target of processing, calculating an inverse-quantized video vector thereof, wherein said video inverse quantization process causes an information processing device to execute: a video element calculation process of calculating an initial inverse-quantized video vector, being a target of processing, in an element unit by employing an element of another video vector having a correlation with the video vector, being said target of processing, and an element of said quantized value vector; and a video vector calculation process of, as said inverse-quantized video vector, calculating a preliminary inverse-quantized video vector for which a total variation norm becomes minimized from a vector space that are decided by another video vector having a correlation with the video vector, being said target of processing, and said quantized value vector with the initial inverse-quantized video vector calculated by said video element calculation process as a starting point.

The present invention for solving the above-mentioned problems is a video decoding program for decoding a quantized value vector, comprising a video inverse quantization process of, from a quantized value vector corresponding to a video vector, being a current target of processing, calculating an inverse-quantized video vector thereof, wherein said video inverse quantization process causes an information processing device to execute: a video element calculation process of calculating an initial inverse-quantized video vector, being a target of processing, in an element unit by employing an element of another video vector having a correlation with the video vector, being said target of processing, and an element of said quantized value vector; and a video vector calculation process of, as said inverse-quantized video vector, calculating a preliminary inverse-quantized video vector for which a total variation norm becomes minimized from a vector space that are decided by another video vector having a correlation with the video vector, being said target of processing, and said quantized value vector with the initial inverse-quantized video vector calculated by said video element calculation process as a starting point.

Advantageous Effect of the Invention

The present invention is capable of provide an inverse quantization method with a high quality, an inverse quantization device, and a program therefor.

BRIEF DESCRIPTION OF DRAWINGS

FIG. 10 is a configuration view of a third exemplary embodiment.
FIG. 11 is a flowchart of the third exemplary embodiment.

DESCRIPTION OF EMBODIMENTS

The principle of the present invention will be briefly explained.

As a rule, there exists a property that "the video signal is configured of a flat region in which the signal value is mildly changed, an edge region in which the signal value is rapidly changed, and a texture region in which the signal value is violently oscillated, and the sense of sight of human being is sensitive to noise in the flat region and the edge region, and is insensible to noise in the texture region."

Therefore, from the aforementioned property, it is thought that the location in which the aforementioned local deterioration is conspicuous is a location of the flat region and the edge region of the video signals. The present invention updates the inverse-quantized video signal vector calculated element by element by the above-described related arts (hereinafter, referred to as an initial inverse-quantized video signal vector) to the inverse-quantized video signal vector such that the oscillation of the above video signal vector becomes smaller (hereinafter, referred to as a final inverse-quantized video signal vector), thereby avoiding the aforementioned local deterioration from becoming conspicuous.

By the way, as a technique of calculating the aforementioned final inverse-quantized video signal vector in which blur in the edge region (to which the sense of sight of human being is sensitive) is few, the present invention utilizes the total variation minimization methods of the Non-patent literature 4, which minimize a total variation norm, the bilateral filter of the Non-patent literature 5, and the like.

Further, the present invention accurately qualifies an aggregation of vectors in which the inverse-quantized video signal vector (the original video signal vector) exists (hereinafter, a vector space corresponding to the aforementioned aggregation of vectors is simply called a sub-vector space), and calculates the aforementioned final inverse-quantized video signal vector within the aforementioned sub-vector space by employing the quantized values, the aforementioned auxiliary information, and the aforementioned conditional probability density function. This makes it possible to effectively suppress the aforementioned blur of the edge region. The present invention greatly differs from the non-patent literature 6 for suppressing noise caused by the JPEG compression with the aforementioned total variation minimization method in a point of accurately qualifying the aforementioned sub-vector space. In the first place, the non-patent literature 6 is not able to take into consideration the method of the related art in which the mean square error of the inverse-quantized video signal vector $\hat{x}$ is reduced by employing the aforementioned auxiliary information.

Continuously, the principle of the present invention will be explained by employing the accompanied drawings.

Figure 3:
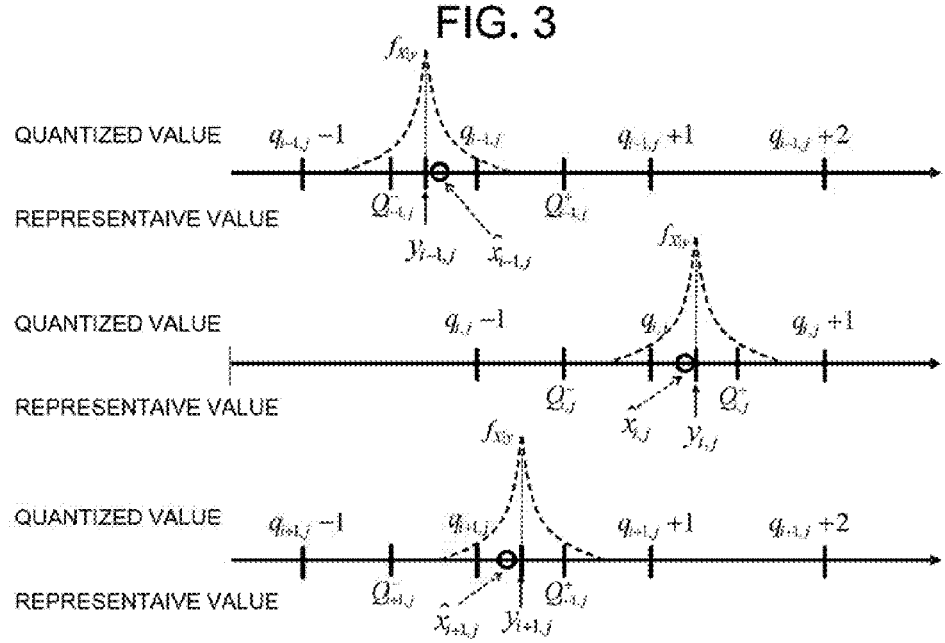
FIG. 3 is a conceptual view of a calculation result of an initial inverse-quantized video signal vector.

The present invention firstly calculates the aforementioned initial inverse-quantized video signal vector similarly to the related arts (FIG. 3).

Figure 4:
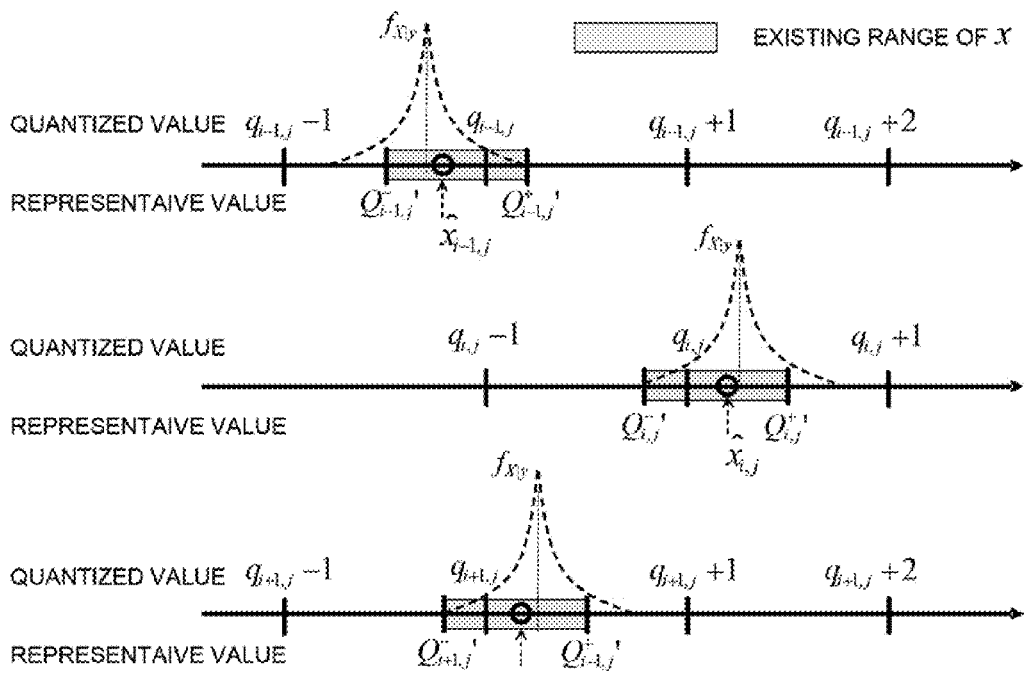
FIG. 4 is a conceptual view of a range.

Continuously, the present invention calculates $[Q_{i,j}^{-\prime}, Q_{i,j}^{+\prime})$, being a range of each element $x_{i,j}$ of the original video vector x from the aforementioned quantized value $q_{i,j}$, the element $y_{i,j}$ of the aforementioned auxiliary information, and the aforementioned conditional probability density function $f_{X|Y}$ (FIG. 4). It is assumed that the sub-vector space to be defined by the range $[Q_{i,j}^{-\prime}, Q_{i,j}^{+\prime})$ of the aforementioned each element $x_{i,j}$ is $U(x \in R^{m \times n}, \forall i=0,\ldots m-1, \forall j=0,\ldots n-1 \, x_{i,j} \in [Q_{i,j}^{-\prime}, Q_{i,j}^{+\prime}))$.

Where $R^{m \times n}$, which is a matrix with m lines x n rows having the elements of a real number, corresponds to the video vector.

In an example of FIG. 4, $[Q_{i,j}^{-\prime}, Q_{i,j}^{+\prime})$, being a range of the aforementioned element $x_{i,j}$, is an overlap of an interval in which a value of $f_{X|Y}$ is larger than 0 (zero) in a domain, and a half-open space $[Q_{i,j}^{-}, Q_{i,j}^{+})$.

Attention should be paid to the fact that apparently, the aforementioned sub-vector space U in which the original video signal vector exists is a sub-vector space more narrowly qualified than the sub-vector space $V(x \in R^{m \times n}, \forall i=0,\ldots m-1, \forall j=0,\ldots n-1 \, x_{i,j} \in [Q_{i,j}^{-}, Q_{i,j}^{+}))$ that is defined by the aforementioned quantized value $q_{i,j}$ (namely, U is a sub-space of V).

Figure 5:
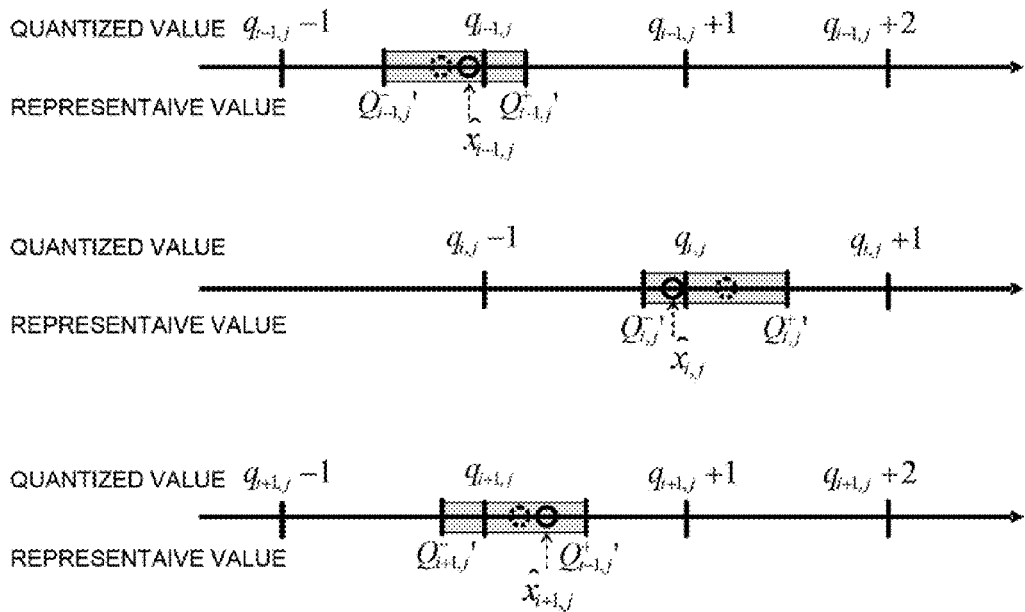
FIG. 5 is a conceptual view of a calculation result of a final inverse-quantized video signal vector.

Finally, the present invention calculates the final inverse-quantized video signal vector with the aforementioned initial inverse-quantized video signal vector as a starting point within the aforementioned sub-vector space U, and outputs its result as the inverse-quantized video vector. For example, FIG. 5 shows an example of having calculated the final inverse-quantized video signal vector such that a total sum $(|x_{i-1,j} - x_{i,j}| + |x_{i,j} - x_{i+1,j}|)$ of absolute value errors between the elements vertically neighboring each other becomes small. The aforementioned final inverse-quantized video vector becomes a video vector in which the oscillation of the signal value in the flat region and the edge region (to which the sense of sight of human being is sensitive) has been suppressed without being blurred. Therefore, the aforementioned local deterioration can be avoided from becoming conspicuous.

Above, the explanation of the principle of the present invention is finished.

With the video inverse-quantization technology founded on the above-described principle of the present invention, the above-mentioned problems of the related arts can be solved.

Further, when the aforementioned auxiliary information is the video signal vector of the frame that neighbors the video signal vector, being a target of the inverse quantization, in a time direction, the inverse-quantized video signal vector should be calculated so that continuity in the time direction is improved. For this, another means of the present invention puts restriction to the calculation of the aforementioned final inverse-quantized video signal vector in such a manner that the corresponding element $x_{i,j}$ of the aforementioned final inverse-quantized video signal vector takes a value near to the element $y_{i,j}$ of the aforementioned auxiliary information when an absolute difference Value between the element $y_{i,j}$ of the aforementioned auxiliary information and an element $\hat{x}_{i,j}$ of the aforementioned initial inverse-quantized video signal vector is smaller than a threshold, or when the element $y_{i,j}$ of the aforementioned auxiliary information is included in the range of the corresponding element of the aforementioned sub-vector space. The present invention makes it possible to improve the continuity in the time direction, and to suppress the flicker of the video.

Further, in the video encoding method for encoding the quantized values, the above-described means of the present invention and the like can be also utilized as a decoding means of locally decoding the above video signals. The present invention makes it possible to provide a higher-quality video encoding method.

Further, in the video decoding method for decoding the quantized values, the above-described means of the present invention and the like can be also utilized as a decoding means of the above video signals. The present invention makes it possible to provide the higher-quality video decoding method.

Hereinafter, specific exemplary embodiments will be explained.

First Exemplary Embodiment of the Present Invention

Figure 6:
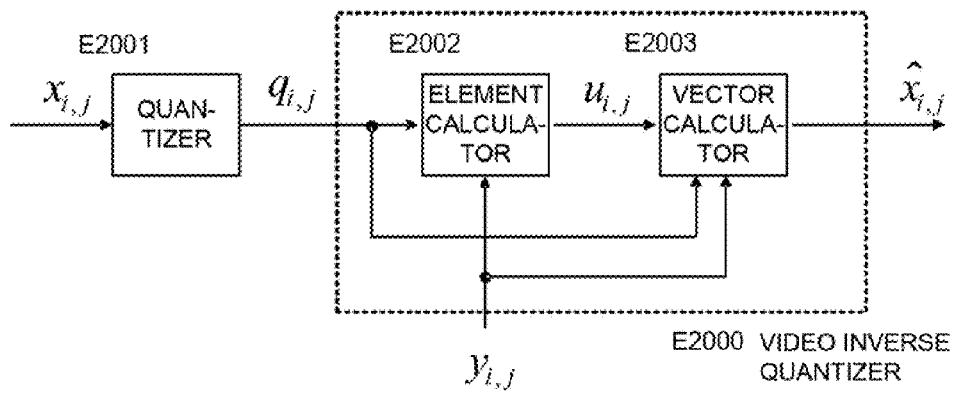
FIG. 6 is a configuration view of a first exemplary embodiment.

A configuration of the video inverse quantization technology of the present invention in this exemplary embodiment will be explained by making a reference to FIG. 6. However, an attention should be paid to the fact that a quantizer E2001 of FIG. 6 is described for a purpose of indicating an input/output relation with a video inverse quantizer E2000 for inverse-quantizing a video, namely to the fact that the video inverse quantization technology of the present invention can be configured only of the video inverse quantizer E2000.

The quantizer E2001 (identical to the quantizer of the related art in FIG. 1) calculates the quantized value $q_{i,j}$ by quantizing each element $x_{i,j} (0 \le i \le m-1, 0 \le j \le n-1)$ of the video signal vector x. Upon assuming the quantizer of E2001 to be a linear quantizer of which a quantization width is $Q_s$, $$q_{i,j} = \text{floor}(x_{i,j}/Q_s + 0.5) \quad (3)$$

is yielded. Hereafter, it is assumed that an aggression of the aforementioned quantized values $q_{i,j}$ is a quantized value vector q.

The video inverse quantizer E2000 is configured of an element calculator E2002 and a vector calculator E2003. The element calculator E2002 and the vector calculator E2003 have the aforementioned quantized value vector q and another video signal vector y (hereafter, referred to as auxiliary information y) having a correlation with the aforementioned video signal vector x as an input, and calculates the inverse-quantized video signal vector $\hat{x}$ Each will be explained below.

The element calculator E2002 calculates each element value $u_{i,j}$ of an initial inverse-quantized video signal vector u by employing the aforementioned quantized value vector q and the aforementioned auxiliary information y to be inputted.

Specifically, upon assuming a conditional probability density function corresponding to the aforementioned correlation to be $f_{X|Y}(x|y)$, and the half-open interval corresponding to the quantized value $q_{i,j}$ to be $[Q_{i,j}^-, Q_{i,j}^+)$ (however, $Q_{i,j}^- = Qs \cdot q_{i,j} - Qs/2, Q_{i,j}^+ = Qs \cdot q_{i,j} + Qs/2$), the element calculator E2002 calculates each element value $u_{i,j}$ by the following conditional expectation value.

$$u_{i,j} = E_{X|y}[x|x \in [Q_{i,j}^-, Q_{i,j}^+), y_{i,j}] = \int_{Q_{i,j}^-}^{Q_{i,j}^+} x \cdot f_{X|y}(x|y_{i,j}) dx \quad (4)$$

However, the element calculator E2002 may calculate each inverse-quantized value by utilizing the following numerical expression (4)' instead of the numerical expression (4).

$$u_{i,j} = \begin{cases} Q_{i,j}^-, & y_{i,j} < Q_{i,j}^- \\ y_{i,j}, & Q_{i,j}^- \le y_{i,j} < Q_{i,j}^+ \\ Q_{i,j}^+, & Q_{i,j}^+ \le y_{i,j} \end{cases} \quad (4)'$$

By the way, when the aforementioned auxiliary information y is a video signal vector of the frame that neighbors the video signal vector x, being a target of the inverse quantization, in the time direction, the inverse-quantized video signal vector should be calculated in such a manner that the continuity in the time direction is improved. For the above calculation, when a absolute difference value between each element $y_{i,j}$ of the aforementioned auxiliary information and the element $u_{i,j}$ obtained by the numerical expression (4) is smaller than a predetermine threshold, or when the element $y_{i,j}$ of the aforementioned auxiliary information is included in the half-open interval $[Q_{i,j}^-, Q_{i,j}^+)$ that corresponds to the corresponding quantized value $q_{i,j}$, the element calculator E2002 may updates $u_{i,j}$ calculated by the numerical expression (4) or the numerical expression (4)' with following numerical expression (5) or the numerical expression (5)'.

$$u_{i,j} = 0.5 \times u_{i,j} + 0.5 \times y_{i,j} \quad (5)$$

$$u_{i,j} = 0.5 \times Qs \times q_{i,j} + 0.5 \times y_{i,j} \quad (5)'$$

Additionally, when $u_{i,j}$ is updated with the numerical equation (5) or the numerical equation (5)', it is more preferable that the aforementioned auxiliary information y is the video signal vector obtained by aligning each element of the video signal vector of the frame that neighbors in the aforementioned time direction with each element of the video signal vector x with a motion-compensated prediction (namely, the aforementioned auxiliary information y may be the video signal vector obtained by aligning each element of the video signal vector of the frame that neighbors in the time direction with each element of the video signal vector x with a motion-compensated prediction).

The vector calculator E2003 updates the initial inverse-quantized video signal vector u to be inputted to the inverse-quantized video signal vector of which the oscillation is smaller, based upon the auxiliary information y to be inputted, and the quantized value vector q, and outputs its update result as the final inverse-quantized video signal vector $\hat{x}$ At first, the vector calculator E2003 calculates $[Q_{i,j}^{-\prime}, Q_{i,j}^{+\prime})$, being a domain of each element $x_{i,j}$, from the aforementioned quantized value $q_{i,j}$, the element $y_{i,j}$ of the aforementioned auxiliary information, and the aforementioned conditional provability density function $f_{X|Y}$ with the following numerical equation (6) and numerical equation (7).

$$Q_{i,j}^{-\prime} = \begin{cases} Q_{i,j}^- & \text{... if } \min\_x < Q_{i,j}^- \text{ or } \max\_x > Q_{i,j}^+ \\ \max(Q_{i,j}^-, \min\_x) & \text{... otherwise} \end{cases} \quad (6)$$

$$Q_{i,j}^{+\prime} = \begin{cases} Q_{i,j}^+ & \text{... if } \max\_x < Q_{i,j}^- \text{ or } \min\_x > Q_{i,j}^+ \\ \min(Q_{i,j}^+, \max\_x) & \text{... otherwise} \end{cases} \quad (7)$$

Where min_x is a minimum value of x in which the aforementioned conditional provability density function $f_{X|Y}$ intersect 0 in the domain, and max_x is a maximum value of x in which the aforementioned conditional provability density function $f_{X|Y}$ intersect 0 in the domain. Additionally, min_x and max_x may be calculated from standard deviation of the aforementioned conditional provability density function $f_{X|Y}$.

Hereafter, it is assumed that the sub-vector space that is defined by the range of each element $x_{i,j}$ obtained by the numerical equation (6) and the numerical equation (7) is U (where, $u \in R^{m \times n}$, $\forall i=0, \ldots m-1$, $\forall j=0, \ldots n-1$, $u_{i,j} \in [Q_{i,j}^{-\prime}, Q_{i,j}^{+\prime}]$).

Continuously, the vector calculator E2003 alternately repeats a first projection and a second projection that are described below by a predetermined number of times k with the initial inverse-quantized video signal vector u (hereafter, described as $u^o$) as a starting point, and calculates the inverse-quantized video signal vector of which the oscillation is smaller from the aforementioned sub-vector space U. Additionally, k, being a superscript of $u^k$ to be described below, corresponds to the aforementioned number of times of successive repetition at a certain time point, and $u^k$ is indicative of the inverse-quantized video signal vector at a time point in which the aforementioned successive repetition has been applied by k times. Further, $u^o$ is the initial inverse-quantized video signal vector.

The aforementioned first projection is a process of updating the inverse-quantized video signal vector $u^k$ to be inputted to an inverse-quantized video signal vector $u^{k+1}$ of which the oscillation is smaller. Specifically, a video signal vector s for minimizing functional F $(s, u^k, \lambda)$ of numerical equation (12), being a sum of an objective function j(s) that is a total variation norm to be defined by the following numerical equation (8), and a constraint function G $(s, u^k, \lambda)$ to be defined by the following numerical equation (11), is calculated, and s, being a solution thereof, is assumed to be $u^{k+1}$.

$$J(s) = \sum_{i=0}^{m-1}\sum_{j=0}^{n-1} |(\nabla s)_{i,j}| = \sum_{i=0}^{m-1}\sum_{j=0}^{n-1} \sqrt{((\nabla s)_{i,j}^v)^2 + ((\nabla s)_{i,j}^h)^2} \quad (8)$$

$$(\nabla s)_{i,j}^v = \begin{cases} s_{i+1,j} - s_{i,j} & \text{... if } i < m-1 \\ 0 & \text{... if } i < m-1 \end{cases} \quad (9)$$

$$(\nabla s)_{i,j}^h = \begin{cases} s_{i+1,j} - s_{i,j} & \text{... if } j < n-1 \\ 0 & \text{... if } j < n-1 \end{cases} \quad (10)$$

$$G(s, u^k, \lambda) = \frac{\|s - u^k\|}{2\lambda} \quad (11)$$

$$F(s, u^k, \lambda) = J(s) + G(s, u^k, \lambda) \quad (12)$$

Formally, a result ($u^{k+1}$) of the first projection is obtained by solving the following numerical equation (13) (namely, the objective function J(s) results being minimized under the constraint function G (s, $u^k$, λ), and hence s of which the total variation norm is small is obtained. That is, s of which the oscillation is small is obtained).

$$u^{k+1} = \arg\min_{s \in R^{m \times n}} \{F(s, u^k, \lambda)\} = \arg\min_{s \in R^{m \times n}} \{J(s) + G(s, u^k, \lambda)\} \quad (13)$$

Additionally, as a method of solving the numerical equation (13), it is enough to utilize sub-gradient methods of the Non-patent literature 6 etc. and projection methods of the Non-patent document 7 etc. Further, it is enough to assume the above-described λ assumed to be a positive real number that depends upon the quantization width Qs.

The aforementioned second projection is a process of restricting the inverse-quantized video signal vector $u^{k+1}$ to be inputted within the aforementioned sub-vector space U. Specifically, the following numerical equation (14) is applied for all elements $u_{i,j}$ of the inverse-quantized video signal vector $u^{k+1}$.

$$u_{i,j} = \max(Q_{i,j}^-, \min(Q_{i,j}^+, u_{i,j})) \quad (14)$$

Finally, the vector calculator E2003 outputs $u^k$ obtained by alternately repeating the above-described first projection and second projection by k times as the aforementioned final inverse-quantized video signal vector $\hat{x}$.

Above, the explanation of a configuration and an operation of the video inverse quantization technology of the present invention in this exemplary embodiment is finished.

Figure 7:
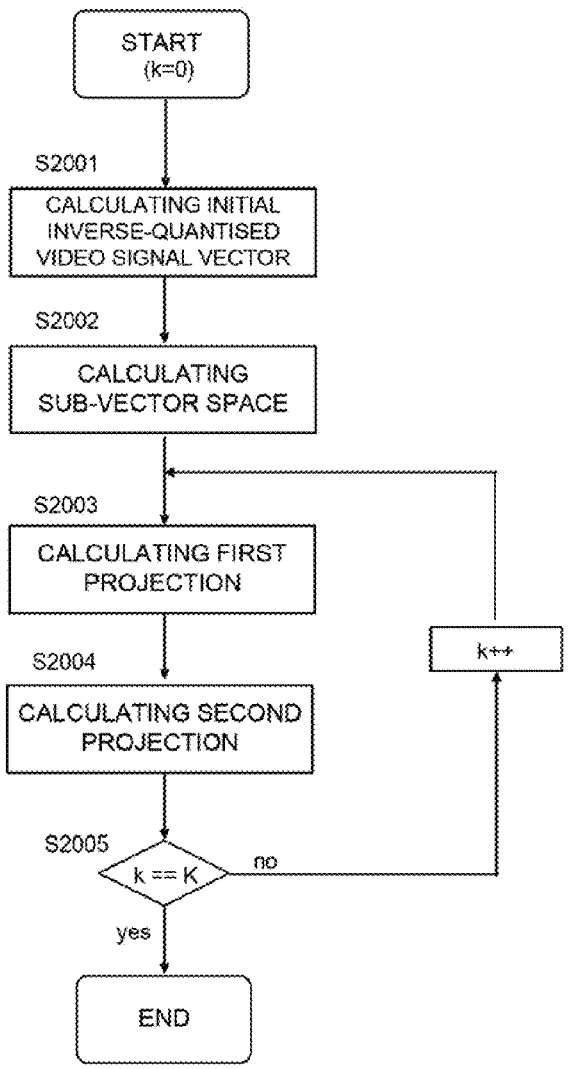
FIG. 7 is a flowchart of the first exemplary embodiment.

Continuously, a flow of the process of the present invention will be explained by making a reference to a flowchart of FIG. 7. However, only a flow inside the video inverse quantizer E2000 related to the present invention will be explained.

A counter is reset (k–0) at the moment of starting the process.

In a step S2001, the above-described element calculator E2002 calculates the initial inverse-quantized video signal vector u. Continuously, the operation proceeds to a step S2002.

In the step S2002, the above-described vector calculator E2003 calculates the sub-vector space U. Continuously, the operation proceeds to a step S2003.

In the step S2003, the above-described vector calculator E2003 updates the current inverse-quantized video signal vector $u^k$ to the inverse-quantized video signal vector $u^{k+1}$ of which the oscillation is smaller with the above-described first projection. Continuously, the operation proceeds to a step S2004.

In the step S2004, the above-described vector calculator E2003 restricts the current inverse-quantized video signal vector $u^{k+1}$ within the sub-vector space U with the above-described second projection. Continuously, the operation proceeds to a step S2005.

In the step S2005, it is determined whether the counter k is equal to a predetermined value K. when it is equal, the process is finished. Otherwise, the counter k is incremented by 1 (one), and the operation returns to the step S2003. Additionally, a variable λ of the above-described first projection is preferably changed to a smaller positive value at the moment that the operation returns to the step S2003.

After the process is finished, $u^k$ is output as the final inverse-quantized video signal vector $\hat{x}$.

Above, the explanation of the flowchart of the present invention in this exemplary embodiment is finished.

Above, the explanation of this exemplary embodiment is finished.

Second Exemplary Embodiment

In this exemplary embodiment, the video inverse quantizer of the present invention in the case that the quantized value, being an input of the video inverse quantizer, is a quantized value of a converted coefficient obtained by frequency-converting the video signal vector will be explained.

Figure 8:
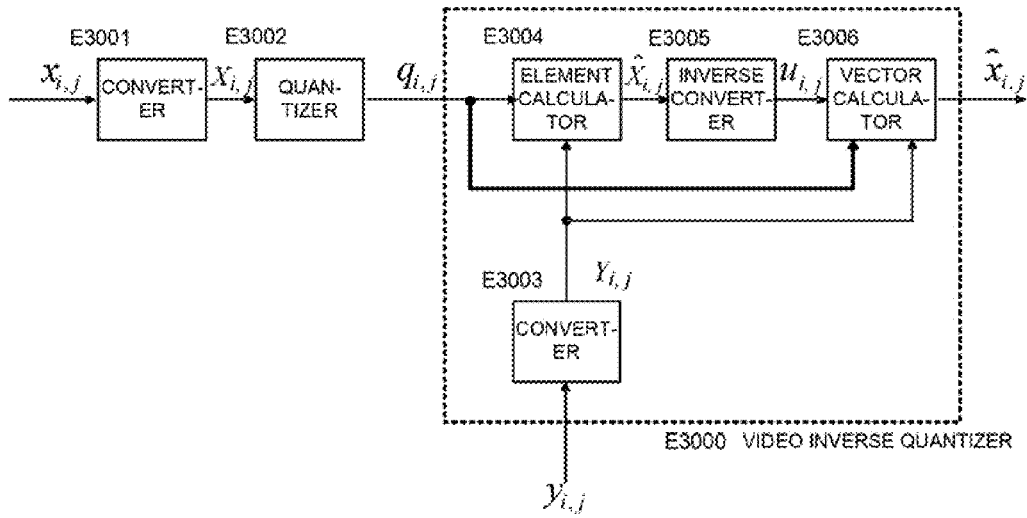
FIG. 8 is a configuration view of a second exemplary embodiment.

A configuration of the video inverse quantization technology of the present invention in this exemplary embodiment will be explained by making a reference to FIG. 8. However, an attention should be paid to the fact that a converter E3001 and a quantizer E3002 of FIG. 8 are described for a purpose of indicating an input/output relation with a video inverse quantizer E3000 for inverse-quantizing the video, namely to the fact that the video inverse quantization technology of the present invention can be configured only of the video inverse quantizer E3000.

The converter E3001 frequency-converts the video signal vector x, and calculates a converted coefficient value $x_{i,j}(0 \leq i \leq m-1, 0 \leq j \leq n-1)$.

As the aforementioned frequency conversion, DCT (Discrete Cosing Transform) with an 8×8 block unit or the like can be utilized. Hereafter, it is assumed that an aggregation of the aforementioned converted coefficient values $X_{i,j}$ is a converted coefficient value vector x.

Figure 1:
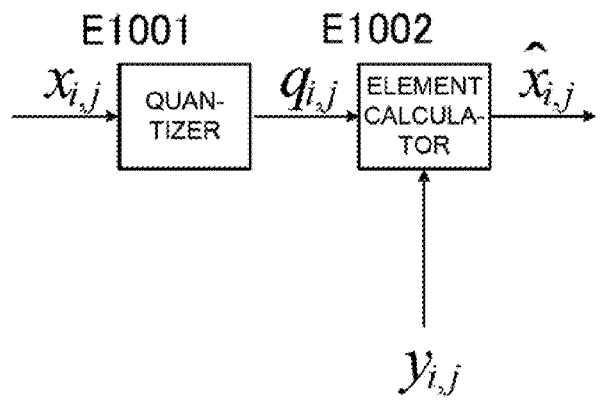
FIG. 1 is an explanatory view of the related art.
Figure 2:
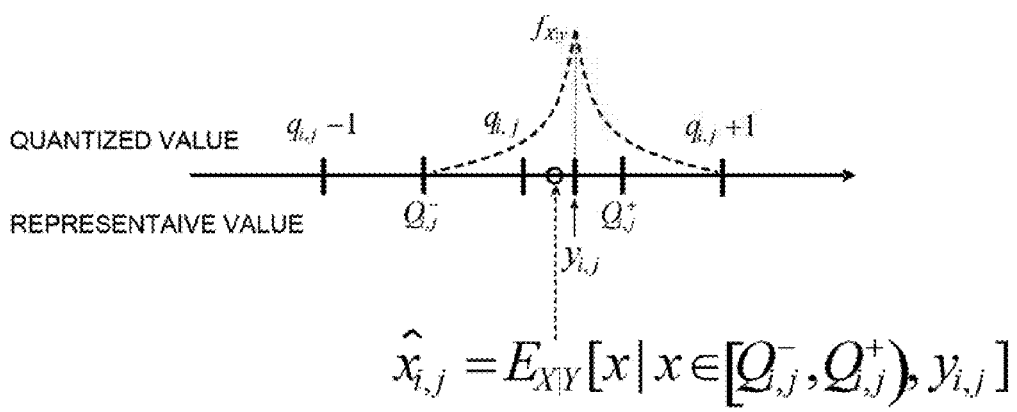
FIG. 2 is a conceptual view of the inverse quantization of elements.

The quantizer E3002 (of which an operation is identical to that of the related art of FIG. 1) quantizes each converted coefficient value $X_{i,j}$ obtained by the converter E3001, and calculates the quantized value $q_{i,j}$. Upon assuming the quantizer of E3002 to be a linear quantizer of which a quantization width is Qs, $$q_{i,j} = \text{sign}(X_{i,j}) \cdot \text{floor}(|X_{i,j}|/Qs + 0.5) \quad (15)$$

is yielded. Where function sign ( ) is a function for returning a code (±) of the input value, being a real number value, and further function floor ( ) is a function for returning a maximum integer, out of the input values, being real number values. Hereafter, it is assumed that an aggregation of the aforementioned quantized values $q_{i,j}$ is a quantized value vector q.

The video inverse quantizer E3000 is configured of a converter E3003, an element calculator E3004, an inverse converter E3005, and a vector calculator E3006. The input of the video inverse quantizer E3000 is the aforementioned quantized value vector q and another video signal vector y having a correlation with the video signal vector x in the frequency region.

The converter E3003, similarly to the converter E3001, frequency-converts the aforementioned another video signal vector y to be inputted, and calculates a converted coefficient value vector Y (hereafter, referred to as auxiliary information Y) thereof.

Continuously, the element calculator E3004 calculates an inverse-quantized converted coefficient value vector $$\hat{X}$$

with each of the aforementioned auxiliary information Y and the aforementioned quantized value vector q as an input. Specifically, upon assuming the half-open interval corresponding to the aforementioned quantized values $q_{i,j}$ to be $$[Q_{i,j}^{-}, Q_{i,j}^{+}) \text{ (however, } Q_{i,j}^{-} = Qs \cdot q_{i,j} - Qs/2, Q_{i,j}^{+} = Q \cdot q_{i,j} + Qs/2)$$

and the conditional probability density function corresponding to the aforementioned correlation to be $f_{x|y}(x|y)$, the element calculator E3004 calculates each element $$\hat{X}_{i,j}$$

with the following numerical equation (16).

$$\hat{X}_{i,j} = E_{X|Y}[X|X \in [Q_{i,j}^{-}, Q_{i,j}^{+}), Y_{i,j}] = \int_{Q_{i,j}^{-}}^{Q_{i,j}^{+}} X \cdot f_{X|y}(X|Y_{i,j}) dX \quad (16)$$

However, the element calculator E3004 may calculate each element $$\hat{X}$$

by utilizing the following numerical equation (16)' instead of the numerical equation (16).

$$\hat{X}_{i,j} = \begin{cases} Q_{i,j}^{-}, & Y_{i,j} < Q_{i,j}^{-} \\ Y_{i,j}, & Q_{i,j}^{-} \le Y_{i,j} < Q_{i,j}^{+} \\ Q_{i,j}^{+}, & Q_{i,j}^{+} \le Y_{i,j} \end{cases} \quad (16)'$$

By the way, when the aforementioned another video signal vector y is the video signal vector of the frame that neighbors the video signal vector x, being a target of the inverse quantization, in the time direction, the inverse-quantized video signal vector should be calculated in such a manner that the continuity in the time direction is improved. For the above calculation, when an absolute difference value between each element $Y_{i,j}$ of the aforementioned auxiliary information and the element $$\hat{X}_{i,j}$$

obtained by the numerical expression (4) is smaller than a predetermine threshold, or when the element $Y_{i,j}$ of the aforementioned auxiliary information is included in the half-open interval $$[Q_{i,j}^{-}, Q_{i,j}^{+})$$

that corresponds to the corresponding quantized value $q_{i,j}$, the element calculator E3004 may updates $$\hat{X}_{i,j}$$

calculated by the numerical expression (16) or the numerical expression (16)' with following numerical expression (17) or the numerical expression (17').

$$\hat{X}_{i,j} = 0.5 \times \hat{X}_{i,j} + 0.5 \times Y_{i,j} \quad (17)$$

$$\hat{X}_{i,j} = 0.5 \times Qs \times q_{i,j} + 0.5 \times Y_{i,j} \quad (17)'$$

Additionally, when $$\hat{X}_{i,j}$$

is updated with the numerical equation (17) or the numerical equation (17)', it is enough that the aforementioned video signal vector y is the video signal vector obtained by aligning each element of the video signal vector of the frame that neighbors in the aforementioned time direction with each element of the video signal vector x with a motion-compensated prediction (namely, the aforementioned another video signal vector y may be the video signal vector obtained by aligning each element of the video signal vector of the frame that neighbors in the time direction with each element of the video signal vector x with a motion-compensated prediction).

Continuously, the inverse converter E3005 performs the inverse frequency conversion for the inverse-quantized converted coefficient value $$\hat{X}$$

obtained by the aforementioned element calculator E3004, and calculates the initial inverse-quantized video signal vector u.

In addition, the vector calculator E3006 updates the initial inverse-quantized video signal vector u obtained by the aforementioned inverse converter E3005 to the inverse-quantized video signal vector of which the oscillation is smaller, based upon the aforementioned quantized value vector q and the aforementioned auxiliary information Y, and outputs it as the final inverse-quantized video signal vector $$\hat{x}.$$

At first, the vector calculator E3006 calculates $$[Q_{i,j}^{-\prime}, Q_{i,j}^{+\prime}),$$

being a range of each element $X_{i,j}$ of the video signal vector in the frequency region, from the aforementioned quantized value $q_{i,j}$, the element $Y_{i,j}$ of the aforementioned auxiliary information, and the aforementioned conditional provability density function $f_{X|Y}$ with the following numerical equation (18) and numerical equation (19).

$$Q_{i,j}^{-\prime} = \begin{cases} Q_{i,j}^{-} & \cdots \text{ if } \max\_x < Q_{i,j}^{-} \text{ or } \min\_x > Q_{i,j}^{+} \\ \max(Q_{i,j}^{-}, \min\_x) & \cdots \text{ otherwise} \end{cases} \quad (18)$$

$$Q_{i,j}^{+\prime} = \begin{cases} Q_{i,j}^{+} & \cdots \text{ if } \max\_x < Q_{i,j}^{-} \text{ or } \min\_x > Q_{i,j}^{+} \\ \min(Q_{i,j}^{+}, \max\_x) & \cdots \text{ otherwise} \end{cases} \quad (19)$$

Where min_x is a minimum value of X in which the aforementioned conditional provability density function $f_{X|Y}$ intersect 0 in the domain, and max_x is a maximum value of X in which the aforementioned conditional provability density function $f_{X|Y}$ intersect 0 in the domain. Additionally, min_x and max_x may be calculated from standard deviation of the aforementioned conditional provability density function $f_{X|Y}$.

Hereafter, it is assumed that the sub-vector space to be defined by the range $$[Q_{i,j}^{-\prime}, Q_{i,j}^{+\prime})$$

of the converted coefficient value $X_{i,j}$ obtained by the numerical equation (18) and the numerical equation (19) is $$U \text{ (however, } X \in R^{m \times n}, \forall i=0, \ldots m-1, \forall j=0, \ldots n-1, X_{i,j} \in [Q_{i,j}^{-\prime}, Q_{i,j}^{+\prime}]).$$

As apparent from the aforementioned definition, the sub-vector space U is a range in the frequency region of the original video signal vector x.

Continuously, the vector calculator E3006 sequentially repeats a first projection to a fourth projection that are described below by a predetermined number of times K with the initial inverse-quantized video signal vector u (hereafter, described as $u^o$) as a starting point, and calculates the inverse-quantized video signal vector of which the oscillation is smaller from the aforementioned sub-vector space U. Additionally, k, being a superscript of $u^k$ to be described below, corresponds to the aforementioned number of times of successive repetition at a certain time point, and $u^k$ is indicative of the inverse-quantized video signal vector at a time point in which the aforementioned successive repetition has been applied k times. Further, $u^o$ is the initial inverse-quantized video signal vector.

The aforementioned first projection is a process of updating the inverse-quantized video signal vector $u^k$ to be inputted to an inverse-quantized video signal vector $u^{k+1}$ of which the oscillation is smaller. Specifically, a video signal vector s for minimizing functional F $(s, u^k, \lambda)$ of numerical equation (24), being a sum of an objective function J(s) that is a total variation norm to be defined by the following numerical equation (20), and a constraint function G $(s, u^k, \lambda)$ to be defined by the following numerical equation (23), is calculated, and s, being a solution thereof, is assumed to be $u^{k+1}$.

$$J(s) = \sum_{i=0}^{m-1}\sum_{j=0}^{n-1} |(\nabla s)_{i,j}| = \sum_{i=0}^{m-1}\sum_{j=0}^{n-1} \sqrt{((\nabla s)^v_{i,j})^2 + ((\nabla s)^h_{i,j})^2} \quad (20)$$

$$(\nabla s)^v_{i,j} = \begin{cases} s_{i+1,j} - s_{i,j} & \cdots \text{ if } i < m-1 \\ 0 & \cdots \text{ if } i < m-1 \end{cases} \quad (21)$$

$$(\nabla s)^h_{i,j} = \begin{cases} s_{i+1,j} - s_{i,j} & \cdots \text{ if } j < n-1 \\ 0 & \cdots \text{ if } j < n-1 \end{cases} \quad (22)$$

$$G(s, u^k, \lambda) = \frac{\|s - u^k\|}{2\lambda} \quad (23)$$

$$F(s, u^k, \lambda) = J(s) + G(s, u^k, \lambda) \quad (24)$$

Formally, a result $(u^{k+1})$ of the first projection is obtained by calculating the following numerical equation (25). Namely, the objective function J(s) results being minimized under the constraint function G $(s, u^k, \lambda)$, and hence s of which the total variation norm is small is obtained. That is, s of which the oscillation is small is obtained.

$$u^{k+1} = \arg\min_{s \in R^{m \times n}} \{F(s, u^k, \lambda)\} = \arg\min_{s \in R^{m \times n}} \{J(s) + G(s, u^k, \lambda)\} \quad (25)$$

Additionally, as a method of calculating the numerical equation (25), it is enough to utilize sub-gradient methods of the Non-patent literature 6 etc. and projection methods of the Non-patent document 7 etc. Further, it is enough to assume the above-described $\lambda$ to be a positive real number that depends upon the quantization width Qs.

The aforementioned second projection projects the inverse-quantized video signal vector $u^{k+1}$ to the frequency region. Specifically, the vector calculator E3006, similarly to the converter E3003, frequency-converts $u^{k+1}$ to the frequency region and calculates the inverse-quantized converted coefficient value vector $U^{k+1}$.

The aforementioned third projection is a process of restricting the inverse-quantized converted coefficient value vector $U^{k+1}$ to be inputted within the aforementioned sub-vector space U. Specifically, the following numerical equation is applied for all elements $U_{i,j}$.

$$U_{i,j} = \max(Q_{i,j}^{-'}, \min(Q_{i,j}^{+'}, U_{i,j})) \quad (26)$$

The aforementioned fourth projection projects the inverse-quantized converted coefficient value vector $U^{k+1}$ to the space region. Specifically, the vector calculator E3006, similarly to the inverse converter E3005, performs the inverse frequency conversion for $U^{k+1}$, and calculates the inverse-quantized video signal vector $u^{k+1}$.

Finally, the vector calculator E3006 outputs $u^k$ obtained by sequentially repeating the above-described first to fourth projection k times as the aforementioned final inverse-quantized video signal vector Above, the explanation of a configuration and an operation of the video inverse quantization technology of the present invention in this exemplary embodiment is finished.

Figure 9:
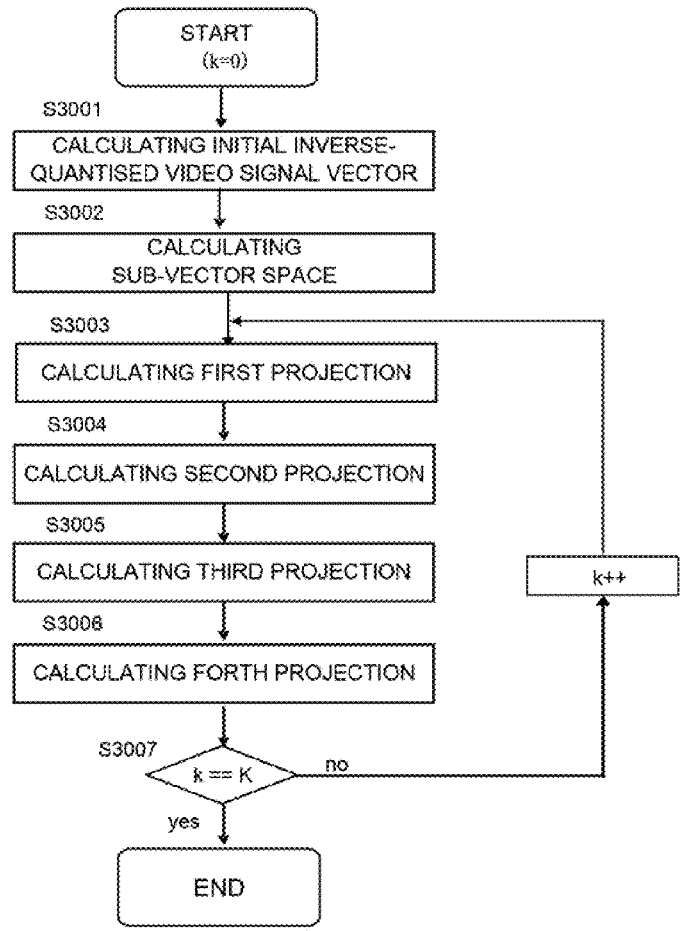
FIG. 9 is a flowchart of the second exemplary embodiment.

Continuously, a flow of the process of the present invention will be explained by making a reference to a flowchart of FIG. 9. However, only a flow inside the video inverse quantizer E3000 related to the present invention will be explained.

At first, the counter is reset (k=0) at the moment of starting the process.

In a step S3001, the above-described element calculator E3004 and the inverse converter E3005 calculates the initial inverse-quantized video signal vector u. Continuously, the operation proceeds to a step S3002.

In the step S3002, the above-described vector calculator E3006 calculates the sub-vector space U. Continuously, the operation proceeds to a step S3003.

In the step S3003, the above-described vector calculator E3006 updates the current inverse-quantized video signal vector $u^k$ to the inverse-quantized video signal vector $u^{k+1}$ of which the oscillation is smaller with the above-described first projection. Continuously, the operation proceeds to a step S3004.

In the step S3004, the above-described vector calculator E3006 converts the inverse-quantized video signal vector $u^{k+1}$ obtained by the step S3003 to the frequency region with the above-described second projection. Continuously, the operation proceeds to a step S3005.

In the step S3005, the above-described vector calculator E3006 restricts the inverse-quantized converted coefficient value vector $U^{k+1}$ obtained by the step S3004 within the aforementioned sub-vector space U with abobe-described third projection. Continuously, the operation proceeds to a step S3006.

In the step S3006, the above-described vector calculator E3006 projects the inverse-quantized converted coefficient value vector $U^{k+1}$ obtained by the step S3005 to the space region with the above-described fourth projection. Continuously, the operation proceeds to a step S3007.

In the step S3007, it is determined whether the counter k is equal to a predetermined value K. When it is equal, the process is finished. Otherwise, the counter k is incremented by 1 (one), and the operation returns to the step S3003. Additionally, the variable $\lambda$ of the above-described first projection is preferably changed to a smaller positive value at the moment that the operation returns to the step S3003.

After the process is finished, $u^k$ is output as the final inverse-quantized video signal vector $\hat{x}$.

Above, the explanation of the flowchart of the present invention in this exemplary embodiment is finished.

Above, the explanation of this exemplary embodiment is finished.

Third Exemplary Embodiment

In this exemplary embodiment, the video inverse quantizer of the present invention in the case that the quantized value, being an input of the video inverse quantizer, is a quantized value of a prediction error value of which the video signal vector has been predicted will be explained.

A configuration of the video inverse quantization technology of the present invention in this exemplary embodiment will be explained by making a reference to FIG. 10. However, an attention should be paid to the fact that a subtractor E4001 and a quantizer E4002 of FIG. 10 are described for a purpose of indicating an input/output relation with a video inverse quantizer E4000 for inverse-quantizing the video, namely to the fact that the video inverse quantization technology of the present invention can be configured only of the video inverse quantizer E4000.

The subtractor E4001 subtracts each element $p_{i,j}$ of a predicted signal vector p from each element $x_{i,j}$ of the video signal vector x, and calculates a predicted error value $$d_{i,j}(0 \le i \le m-1, 0 \le j \le n-1).$$

$$d_{i,j} = x_{i,j} - p_{i,j} \quad (27)$$

Hereafter, it is assumed that an aggression of the aforementioned predicted error values $d_{i,j}$ is a predicted error value vector d.

Additionally, when the video inverse quantizer E4000 is activated in a unit smaller than the video frame (for example, one element unit), the predicted signal generated from the already-processed element $$(u \text{ or } \hat{x})$$

that neighbors the element, being a current target of processing, or the like can be utilized as the aforementioned predicted signal vector p.

The quantizer E4002 (of which an operation is identical to that of the related art of FIG. 1) quantizes each element $d_{i,j}$ of the video signal vector d, and calculates a quantized value $q_{i,j}$. Upon assuming the quantizer of E4002 to be a linear quantizer of which a quantization width is Qs, $$q_{i,j} = \text{sign}(d_{i,j}) \cdot \text{floor}(|d_{i,j}|/Qs + 0.5) \quad (28)$$

is yielded. Where function sign ( ) is a function for returning a code (±) of the input value, being a real number value, and further function floor ( ) is a function for returning a maximum integer, out of the input values, being real number values. Hereafter, it is assumed that an aggregation of the aforementioned quantized values $q_{i,j}$ is a quantized value vector q.

The input of the video inverse quantizer E4000 is the aforementioned quantized value vector q, another video signal vector y having a correlation with the video signal vector x (hereafter, referred to as auxiliary information y), and the aforementioned predicted signal vector p. The video inverse quantizer E4000 is configured of an element calculator E4003, and a vector calculator E4004. Each will be explained below.

The element calculator E4003 calculates each element $u_{i,j}$ of the initial inverse-quantized video signal vector u by employing the aforementioned quantized value vector q, the aforementioned auxiliary information y, and the aforementioned predicted signal vector p.

Specifically, upon assuming the half-open interval corresponding to the aforementioned quantized values $q_{i,j}$ to be $$[Q_{i,j}^-, Q_{i,j}^+) \text{ (however, } Q_{i,j}^- = Qs \cdot q_{i,j} - Qs/2, Q_{i,j}^+ = Qs \cdot q_{i,j} + Qs/2)$$

and the conditional probability density function corresponding to the aforementioned correlation to be $f_{x|y}(x|y)$, the element calculator E4003 calculates each element $u_{i,j}$ with the following numerical equation (29).

$$u_{i,j} = p_{i,j} + E_{X|y}[x \mid x \in [Q_{i,j}^- - p_{i,j}, Q_{i,j}^+ - p_{i,j}), y_{i,j} - p_{i,j}] \quad (29)$$

$$= p_{ij} + \int_{Q_{i,j}^- - p_{i,j}}^{Q_{i,j}^+ - p_{i,j}} x \cdot f_{X|y}(x \mid y_{i,j} - p_{i,j}) dx$$

However, the element calculator E4003 may calculate each inverse-quantized value $u_{i,j}$ by utilizing the following numerical equation (29)' instead of the numerical equation (29).

$$u_{i,j} = \begin{cases} p_{i,j} + Q_{i,j}^-, & y_{i,j} < p_{i,j} + Q_{i,j}^- \\ y_{i,j}, & p_{i,j} + Q_{i,j}^- \le y_{i,j} < p_{i,j} + Q_{i,j}^+ \\ p_{i,j} + Q_{i,j}^+, & p_{i,j} + Q_{i,j}^+ \le y_{i,j} \end{cases} \quad (29)'$$

By the way, when the aforementioned auxiliary information y is the video signal vector of the frame that neighbors the video signal vector x, being a target of the inverse quantization, in the time direction, the inverse-quantized video signal vector should be calculated in such a manner that the continuity in the time direction is improved. For the above calculation, the element calculator E4003 may update $u_{i,j}$ calculated by the numerical equation (29) or the numerical equation (29)' with the following numerical equation (30) or numerical equation (30)' when an absolute difference value between each element $y_{i,j}$ of the aforementioned auxiliary information and the element $u_{i,j}$ obtained by the numerical expression (29) is smaller than a predetermine threshold, or when the value obtained by subtracting the element $p_{i,j}$ of the predicted error value vector from the element $y_{i,j}$ of the aforementioned auxiliary information is included in the half-open interval $$[Q_{i,j}^-, Q_{i,j}^+)$$

that corresponds to the corresponding quantized value $q_{i,j}$.

$$u_{i,j} = 0.5 \times u_{i,j} + 0.5 \times y_{i,j} \quad (30)$$

$$u_{i,j} = p_{i,j} + 0.5 \times Qs \times q_{i,j} + 0.5 \times (y_{i,j} - p_{i,j}) \quad (30)'$$

Additionally, when $u_{i,j}$ is updated with the numerical equation (30) or the numerical equation (30)', it is enough that the aforementioned auxiliary information y is the video signal vector obtained by aligning each element of the video signal vector of the frame that neighbors in the aforementioned time direction with each element of the video signal vector x with a motion-compensated prediction. Namely, the aforementioned auxiliary information y may be the video signal vector obtained by aligning each element of the video signal vector of the frame that neighbors in the time direction with each element of the video signal vector x with a motion-compensated prediction.

The vector calculator E4004 updates the initial inverse-quantized video signal vector u to be inputted to the inverse-quantized video signal vector of which the oscillation is smaller, based upon and the aforementioned quantized value vector q, the aforementioned auxiliary information y, and the aforementioned predicted signal vector p, and outputs an update result as the final inverse-quantized video signal vector $\hat{x}$.

At first, the vector calculator E4004 calculates a range)

$[Q_{i,j}^{-\prime}, Q_{i,j}^{+\prime})$ of each predicted error $d_{i,j}$ from the aforementioned quantized value $q_{i,j}$, the element $y_{i,j}$ of the aforementioned auxiliary information, the element $_{i,j}$ of the aforementioned signal vector, and the aforementioned conditional provability density function $f_{X|Y}$ with the following numerical equation (31) and numerical equation (32).

$$Q_{i,j}^{-\prime} = \begin{cases} Q_{i,j}^- & \cdots \text{ if } \max\_x < p_{i,j} + Q_{i,j}^- \text{ or } \min\_x > p_{i,j} + Q_{i,j}^+ \\ \max(Q_{i,j}^-, \min\_x - p_{i,j}) & \cdots \text{ otherwise} \end{cases} \quad (31)$$

$$Q_{i,j}^{+\prime} = \begin{cases} Q_{i,j}^+ & \cdots \text{ if } \max\_x < p_{i,j} + Q_{i,j}^- \text{ or } \min\_x > p_{i,j} + Q_{i,j}^+ \\ \min(Q_{i,j}^+, \max\_x - p_{i,j}) & \cdots \text{ otherwise} \end{cases} \quad (32)$$

Where min_x is a minimum value of x in which the aforementioned conditional provability density function $f_{X|Y}$ intersect 0 in the domain, and max_x is a maximum value of x in which the aforementioned conditional provability density function $f_{X|Y}$ intersect 0 in the domain. Additionally, min_x and max_x may be calculated from standard deviation of the aforementioned conditional provability density function $f_{X|Y}$.

Hereafter, it is assumed that the sub-vector space that is defined by the range $[Q_{i,j}^{\prime}, Q_{i,j}^{+\prime})$ of the predicted error $d_{i,j}$ obtained by the numerical equation (31) and the numerical equation (32), and the corresponding predicted value $p_{i,j}$ is $U$(however, $u \in R^{m \times n}, \forall i = 0, \ldots m-1, \forall j = 0, \ldots n-1, u_{i,j} \in [p_{i,j} + Q_{i,j}^{-\prime}, p_{i,j} + Q_{i,j}^{+\prime}])$.

As apparent from the aforementioned definition, the sub-vector space U is the range of the original video signal vector x.

Continuously, the vector calculator E4004 alternately repeats a first projection and a second projection that are described below by a predetermined number of times K with the initial inverse-quantized video signal vector u (hereafter, described as $u^o$) as a starting point, and calculates the inverse-quantized video signal vector of which the oscillation is smaller from the aforementioned sub-vector space U. Additionally, k, being a superscript of $u^k$ to be described below, corresponds to the aforementioned number of times of successive repetition at a certain time point, and $u^k$ is indicative of the inverse-quantized video signal vector at a time point in which the aforementioned repetition has been applied k times. Further, $u^o$ is the initial inverse-quantized video signal vector.

The aforementioned first projection is a process of updating the inverse-quantized video signal vector $u^k$ to be inputted to an inverse-quantized video signal vector $u^{k+1}$ of which the oscillation is smaller. Specifically, a video signal vector s for minimizing functional (s, $u^k$, $\lambda$) of numerical equation (37), being a sum of a total variation norm J(s) of the following numerical equation (33), and a constraint term G (s, $u^k$, $\lambda$) of the following numerical equation (36), is calculated and s, being a solution thereof, is assumed to be $u^{k+1}$.

$$J(s) = \sum_{i=0}^{m-1}\sum_{j=0}^{n-1} |(\nabla s)_{i,j}| = \sum_{i=0}^{m-1}\sum_{j=0}^{n-1} \sqrt{((\nabla s)_{i,j}^v)^2 + ((\nabla s)_{i,j}^h)^2} \quad (33)$$

$$(\nabla s)_{i,j}^v = \begin{cases} s_{i+1,j} - s_{i,j} & \cdots \text{ if } i < m-1 \\ 0 & \cdots \text{ if } i < m-1 \end{cases} \quad (34)$$

$$(\nabla s)_{i,j}^h = \begin{cases} s_{i,j+1} - s_{i,j} & \cdots \text{ if } j < n-1 \\ 0 & \cdots \text{ if } j < n-1 \end{cases} \quad (35)$$

$$G(s, u^k, \lambda) = \frac{\|s - u^k\|}{2\lambda} \quad (36)$$

$$F(s, u^k, \lambda) = J(s) + G(s, u^k, \lambda) \quad (37)$$

Formally, a result ($u^{k+1}$) of the first projection is obtained by calculating the following numerical equation (38) (namely, the objective function J(s) results being minimized under the constraint function G (s, $u^k$, $\lambda$), and hence s of which the total variation norm is small is obtained. That is, s of which the oscillation is small is obtained).

$$u^{k+1} = \arg\min_{s \in R^{m \times n}} \{F(s, u^k, \lambda)\} = \arg\min_{s \in R^{m \times n}} \{J(s) + G(s, u^k, \lambda)\} \quad (38)$$

Additionally, as a method of calculating the numerical equation (38), it is enough to utilize sub-gradient methods of the Non-patent literature 6 etc. and projection methods of the Non-patent document 7 etc. Further, it is enough to assume the above-described $\lambda$ to be a positive real number that depends upon the quantization width Qs.

The aforementioned second projection is a process of restricting the inverse-quantized video signal vector $u^{k+1}$ to be inputted within the aforementioned sub-vector space U.

Specifically, the following numerical equation (39) is applied for all elements $u_{i,j}$ of the inverse-quantized video signal vector $u^{k+1}$.

$$u_{i,j} = \max(p_{i,j} + Q_{i,j}^{-\prime}, \min(p_{i,j} + Q_{i,j}^{+\prime}, u_{i,j})) \quad (39)$$

Finally, the vector calculator E4004 outputs $u^k$ obtained by alternately repeating the above-described first projection and second projection k times as the aforementioned final inverse-quantized video signal vector $\hat{x}$.

Above, the explanation of a configuration and an operation of the video inverse quantization technology of the present invention in this exemplary embodiment is finished.

Continuously, a flow of the process of the present invention will be explained by making a reference to a flowchart of FIG. 11. However, only a flow inside the video inverse quantizer E4000 related to the present invention will be explained.

At first, the counter is reset (k=0) at the moment of starting the process.

In a step S4001, the above-described element calculator E4003 calculates the initial inverse-quantized video signal vector u. Continuously, the operation proceeds to a step S4002.

In the step S4002, the above-described vector calculator E4004 calculates the sub-vector space U. Continuously, the operation proceeds to a step S4003.

In the step S4003, the above-described vector calculator E4004 updates the current inverse-quantized video signal vector $u^k$ to the inverse-quantized video signal vector $u^{k+1}$ of which the oscillation is smaller with the above-described first projection. Continuously, the operation proceeds to a step S4004.

In the step S4004, the above-described vector calculator E4004 restricts $u^{k+1}$ obtained by the step S4003 within the sub-vector space U with the above-described second projection. Continuously, the operation proceeds to a step S4005.

In the step S4005, it is determined whether the counter k is equal to a predetermined value K. When it is equal, the process is finished. Otherwise, the counter k is incremented by 1 (one), and the operation returns to the step S4003. Additionally, the variable λ of the above-described first projection is preferably changed to a smaller positive value at the moment that the operation returns to the step S4003.

After the process is finished, $u^k$ is output as the final inverse-quantized video signal vector $\hat{x}$.

Above, the explanation of the flowchart of the present invention in this exemplary embodiment is finished.

Above, the explanation of this exemplary embodiment is finished.

Fourth Exemplary Embodiment

In this exemplary embodiment, the video inverse quantizer of the present invention in the case that the quantized value, being an input of the video inverse quantizer, is a quantized value of a converted coefficient obtained by frequency-converting the predicted error in which the video signal vector has been predicted will be explained.

Figure 12:
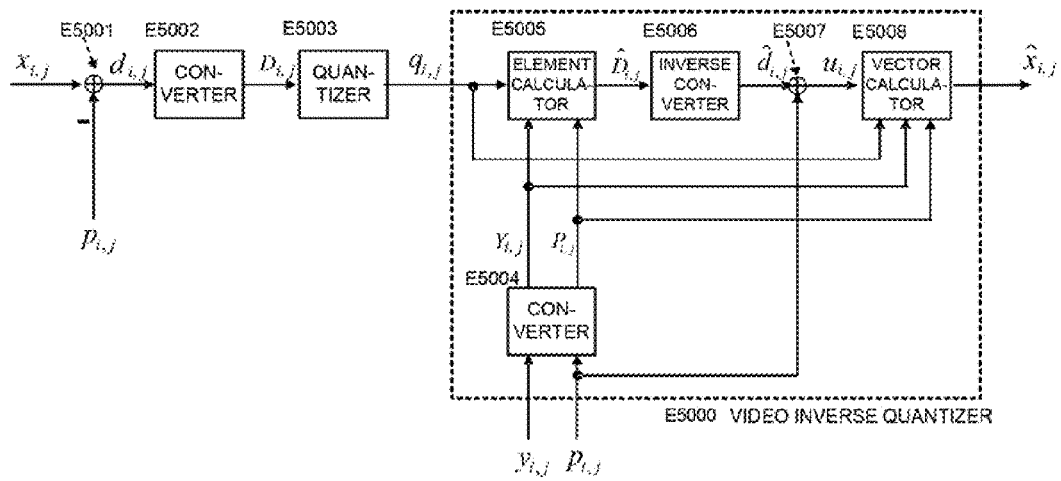
FIG. 12 is a configuration view of a fourth exemplary embodiment.

A configuration of the video inverse quantization technology of the present invention in this exemplary embodiment will be explained by making a reference to FIG. 12. However, an attention should be paid to the fact that a converter E5002 and a quantizer E5003 of FIG. 12 are described for a purpose of indicating an input/output relation with a video inverse quantizer E5000 for inverse-quantizing the video, namely to the fact that the video inverse quantization technology of the present invention can be configured only of the video inverse quantizer E5000.

A subtractor E5001 subtracts each element $p_{i,j}$ of the predicted signal vector p from each element $x_{i,j}$ of the video signal vector x, and calculates a predicted error value $d_{i,j}(0 \leq i \leq m-1, 0 \leq j \leq n-1)$.

$$d_{i,j} = x_{i,j} - p_{i,j} \quad (40)$$

Hereafter, it is assumed that an aggression of the aforementioned predicted error values $d_{i,j}$ is a predicted error value vector d.

Additionally, when the video inverse quantizer E5000 is activated in a unit of the frequency conversion to be later described (for example, an 8×8 block unit), the predicted signal generated from the already-processed element ($u$ or $\hat{x}$)

that neighbors an 8×8 block, being a current target of processing, or the like can be utilized as the aforementioned predicted signal vector p.

The converter E5002 frequency-converts the aforementioned predicted error value vector d, and calculates a converted coefficient value $D_{i,j}(0 \leq i \leq m-1, 0 \leq j \leq n-1)$.

As the aforementioned frequency transform, DCT (Discrete Cosine Transform) with the 8×8 block unit or the like can be utilized. Hereafter, it is assumed that an aggregation of the aforementioned $D_{i,j}$ is a converted coefficient value vector D.

The quantizer E5003 (of which an operation is identical to that of the related art of FIG. 1) quantizes each converted coefficient value $D_{i,j}$ obtained by the converter E5002, and calculates the quantized value $q_{i,j}$. Upon assuming the quantizer of E5003 to be a linear quantizer of which a quantization width is $Q_s$, $$q_{i,j} = \text{sign}(D_{i,j}) \cdot \text{floor}(|D_{i,j}|/Q_s + 0.5) \quad (41)$$

is yielded. Where function sign ( ) is a function for returning a code (±) of the input value, being a real number value, and further function floor ( ) is a function for returning a maximum integer, out of the input values, being real number values. Hereafter, it is assumed that an aggregation of the aforementioned quantized values $q_{i,j}$ is a quantized value vector q.

The video inverse quantizer E5000 is configured of a converter E5004, an element calculator E5005, an inverse converter E5006, adder E5007, and a vector calculator E5008.

The input of the video inverse quantizer E5000 is the aforementioned quantized value vector q, another video signal vector y having a correlation with the video signal vector x in the frequency region, and the aforementioned predicted signal vector p.

The converter E5004, similarly to the converter E5002, frequency-converts the aforementioned another video signal vector y, and the aforementioned predicted signal vector, respectively, and calculates a converted coefficient value vector Y (hereafter, referred to as auxiliary information Y) and a predicted converted coefficient value vector P.

The element calculator E5005 calculates an inverse-quantized converted coefficient value vector $\hat{D}$ with each of the aforementioned quantized value vector q, the aforementioned auxiliary information Y and the aforementioned predicted converted coefficient value vector P as an input.

Specifically, upon assuming the half-open interval corresponding to the aforementioned quantized values $q_{i,j}$ to be $[Q_{i,j}^-, Q_{i,j}^+)$ (however, $Q_{i,j}^- = Q_s \cdot q_{i,j} - Q_s/2$, $Q_{i,j}^+ = Q_s \cdot q_{i,j} + Q_s/2$)

and the conditional probability density function corresponding to the aforementioned correlation to be $f_{X|Y}(X|Y)$, the element calculator E5005 calculates each inverse-quantized converted coefficient $\hat{D}_{i,j}$, being an element of the aforementioned inverse-quantized converted coefficient value vector with the following numerical equation (42).

$$\hat{D}_{i,j} = E_{X|Y}[X|X \in [Q_{i,j}^- - P_{i,j}, Q_{i,j}^+ - P_{i,j}), Y_{i,j} - P_{i,j}] = \int_{Q_{i,j}^- - P_{i,j}}^{Q_{i,j}^+ - P_{i,j}} X \cdot f_{X|Y}(X|Y_{i,j} - P_{i,j}) dX \quad (42)$$

However, the element calculator E5005 may calculate each inverse-quantized converted coefficient $\hat{D}_{i,j}$ by utilizing the following numerical equation (42)' instead of the numerical equation (42).

$$\hat{D}_{i,j} = \begin{cases} Q^-_{i,j}, & Y_{i,j} < P_{i,j} + Q^-_{i,j} \\ Y_{i,j} - P_{i,j}, & P_{i,j} + Q^-_{i,j} \le Y_{i,j} < P_{i,j} + Q^+_{i,j} \\ Q^+_{i,j}, & P_{i,j} + Q^+_{i,j} \le Y_{i,j} \end{cases} \quad (42)'$$

By the way, when the aforementioned another video signal vector y is the video signal vector of the frame that neighbors the video signal vector x, being a target of the inverse quantization, in the time direction, the inverse-quantized video signal vector should be calculated in such a manner that the continuity in the time direction is improved. For the above calculation, when an absolute difference value between the value obtained by subtracting the aforementioned predicted converted coefficient value vector P from the aforementioned auxiliary information Y and the inverse-quantized converted coefficient $\hat{D}_{i,j}$ obtained by the numerical expression (42) is smaller than a predetermine threshold, or when the value obtained by subtracting the aforementioned predicted converted coefficient value vector P from the aforementioned auxiliary information Y is included in the corresponding aforementioned half-open interval $[Q^-_{i,j}, Q^+_{i,j})$, the element calculator E5005 may update the inverse-quantized converted coefficient $\hat{D}_{i,j}$ calculated by the numerical expression (42) or the numerical expression (42)' with following numerical expression (43) or the numerical expression (43)'.

$$\hat{D}_{i,j} = 0.5 \times \hat{D}_{i,j} + 0.5 \times (Y_{i,j} - P_{i,j}) \quad (43)$$

$$\hat{D}_{i,j} = 0.5 \times Qs \times q_{i,j} + 0.5 \times (Y_{i,j} - P_{i,j}) \quad (43)'$$

Additionally, when $\hat{D}_{i,j}$ is updated with the numerical equation (43) or the numerical equation (43)', it is more preferable that the aforementioned video signal vector y is the video signal vector obtained by aligning each element of the video signal vector of the frame that neighbors in the aforementioned time direction with each element of the video signal vector x with a motion-compensated prediction. Namely, the aforementioned another video signal vector y may be the video signal vector obtained by aligning each element of the video signal vector of the frame that neighbors in the time direction with each element of the video signal vector x with a motion-compensated prediction.

Continuously, the inverse converter E5006 subjects the inverse-quantized converted coefficient value vector $\hat{D}$ obtained by the aforementioned element calculator E5005 to the inverse frequency conversion, and calculates an inverse-quantized predicted error value vector $\hat{a}$.

In addition, the adder E5007 adds the aforementioned predicted signal vector p to the aforementioned inverse-quantized predicted error value vector $\hat{a}$ and calculates the initial inverse-quantized video signal vector u. Additionally, with the case of the exemplary embodiment in which the above-described element calculator E5005 supplies the vector obtained by adding the aforementioned predicted converted coefficient value vector P to the inverse-quantized converted coefficient $\hat{D}_{i,j}$ to the adder E5007, the adder E5007 is unnecessary.

The vector calculator E5008 updates the initial inverse-quantized video signal vector u obtained by the aforementioned inverse converter E5006 to the inverse-quantized video signal vector of which the oscillation is smaller, based upon the aforementioned quantized value vector q, the aforementioned auxiliary information Y, and the aforementioned predicted converted coefficient value vector P, and outputs it as the final inverse-quantized video signal vector $\hat{x}$.

At first, the vector calculator E5008 calculates $[Q^-_{i,j}{}', Q^+_{i,j}{}')$, being a range of each converted coefficient value $D_{i,j}$, from the aforementioned quantized value $q_{i,j}$, the element $Y_{i,j}$ of the aforementioned auxiliary information, the element $P_{i,j}$ of the aforementioned predicted converted coefficient value vector, and the aforementioned conditional provability density function $f_{X|Y}$ with the following numerical equation (44) and numerical equation (45).

$$Q^-_{i,j}{}' = \begin{cases} Q^-_{i,j} & \cdots \text{ if } \max\_x < P_{i,j} + Q^-_{i,j} \text{ or } \min\_x > P_{i,j} + Q^+_{i,j} \\ \max(Q^-_{i,j}, \min\_x - P_{i,j}) & \cdots \text{ otherwise} \end{cases} \quad (44)$$

$$Q^+_{i,j}{}' = \begin{cases} Q^+_{i,j} & \cdots \text{ if } \max\_x < P_{i,j} + Q^-_{i,j} \text{ or } \min\_x > P_{i,j} + Q^+_{i,j} \\ \min(Q^+_{i,j}, \max\_x - P_{i,j}) & \cdots \text{ otherwise} \end{cases} \quad (45)$$

Where min_x is a minimum value of X in which the aforementioned conditional provability density function $f_{X|Y}$ intersect 0 in the domain, and max_x is a maximum value of X in which the aforementioned conditional provability density function $f_{X|Y}$ intersect 0 in the domain. Additionally, min_x and max_x may be calculated from standard deviation of the aforementioned conditional provability density function $f_{X|Y}$.

Hereafter, it is assumed that the sub-vector space that is defined by the range $[Q^-_{i,j}{}', Q^+_{i,j}{}')$ of the converted coefficient value $x_{i,j}$ obtained by the numerical equation (44) and the numerical equation (45) and the corresponding element $P_{i,j}$ of the aforementioned predicted converted coefficient value vector P is $U$(however, $X \in R^{m \times n}$, $\forall i=0, \ldots m-1, \forall j=0, \ldots n-1, X_{i,j} \in [P_{i,j}+Q^-_{i,j}{}', P_{i,j}+Q^+_{i,j}{}'])$.

As apparent from the aforementioned definition, the sub-vector space U is a range in the frequency region of the original video signal vector x.

Continuously, the vector calculator E5008 sequentially repeats a first projection to a fourth projection that are described below by a predetermined number of times K with the initial inverse-quantized video signal vector u (hereafter, described as u°) as a starting point, and calculates the inverse-quantized video signal vector of which the oscillation is smaller from the aforementioned sub-vector space u. Additionally, k, being a superscript of $u^k$ to be described below, corresponds to the aforementioned number of times of successive repetition at a certain time point, and $u^k$ is indicative of the inverse-quantized video signal vector at a time point in which the aforementioned successive repetition has been applied k times. Further, $u^o$ is the initial inverse-quantized video signal vector.

The aforementioned first projection is a process of updating the inverse-quantized video signal vector $u^k$ to be inputted to an inverse-quantized video signal vector $u^{k+1}$ of which the oscillation is smaller. Specifically, a video signal vector s for minimizing functional F $(s, u^k, \lambda)$ of numerical equation (50), being a sum of an objective function J(s), being a total variation norm to be defined by the following numerical equation (46), and a constraint function G $(s, u^k, \lambda)$ to be defined by the following numerical equation (49), is calculated, and s, being a solution thereof, is assumed to be to be $u^{k+1}$.

$$J(s) = \sum_{i=0}^{m-1}\sum_{j=0}^{n-1} |(\nabla s)_{i,j}| = \sum_{i=0}^{m-1}\sum_{j=0}^{n-1} \sqrt{((\nabla s)_{i,j}^v)^2 + ((\nabla s)_{i,j}^h)^2} \quad (46)$$

$$(\nabla s)_{i,j}^v = \begin{cases} s_{i+1,j} - s_{i,j} & \cdots \text{ if } i < m-1 \\ 0 & \cdots \text{ if } i < m-1 \end{cases} \quad (47)$$

$$(\nabla s)_{i,j}^h = \begin{cases} s_{i,j+1} - s_{i,j} & \cdots \text{ if } j < n-1 \\ 0 & \cdots \text{ if } j < n-1 \end{cases} \quad (48)$$

$$G(s, u^k, \lambda) = \frac{\|s - u^k\|}{2\lambda} \quad (49)$$

$$F(s, u^k, \lambda) = J(s) + G(s, u^k, \lambda) \quad (50)$$

Formally, a result $(u^{k+1})$ of the first projection is obtained by calculating the following numerical equation (namely, the objective function J(s) results being minimized under the constraint function G $(s, u^k, \lambda)$, and hence, the objective function J(s) is minimized, and s of which the total variation norm is small is obtained. That is, s of which the oscillation is small is obtained).

$$u^{k+1} = \arg\min_{s \in R^{m \times n}} \{F(s, u^k, \lambda)\} = \arg\min_{s \in R^{m \times n}} \{J(s) + G(s, u^k, \lambda)\} \quad (51)$$

Additionally, as a method of calculating the numerical equation (51), it is enough to utilize sub-gradient methods of the Non-patent literature 6 etc. and projection methods of the Non-patent document 7 etc. Further, it is enough to assume the above-described $\lambda$ to be a positive real number that depends upon the quantization width Qs.

The aforementioned second projection projects the inverse-quantized video signal vector $u^{k+1}$ to the frequency region. Specifically, the vector calculator E5008, similarly to the converter E5004, frequency-converts $u^{k+1}$ to the frequency region and calculates the inverse-quantized converted coefficient value vector $U^{k+1}$.

The aforementioned third projection is a process of restricting the inverse-quantized converted coefficient value vector $U^{k+1}$ to be inputted within the aforementioned sub-vector space U. Specifically, the following numerical equation is applied for all elements $U_{i,j}$ $$U_{i,j} = \max(P_{i,j} + Q_{i,j}^-, \min(P_{i,j} + Q_{i,j}^+, U_{i,j})) \quad (52)$$

The aforementioned fourth projection projects the inverse-quantized converted coefficient value vector $U^{k+1}$ to the space region. Specifically, the vector calculator E5008, similarly to the inverse converter E5006, subjects $U^{k+1}$ to the inverse frequency conversion, and calculates the inverse-quantized video signal vector $u^{k+1}$.

Finally, the vector calculator E5008 outputs $u^k$ obtained by sequentially repeating the above-described first to fourth projections k times as the aforementioned final inverse-quantized video signal vector $\hat{x}$.

Above, the explanation of a configuration and an operation of the video inverse quantization technology of the present invention in this exemplary embodiment is finished.

Figure 13:
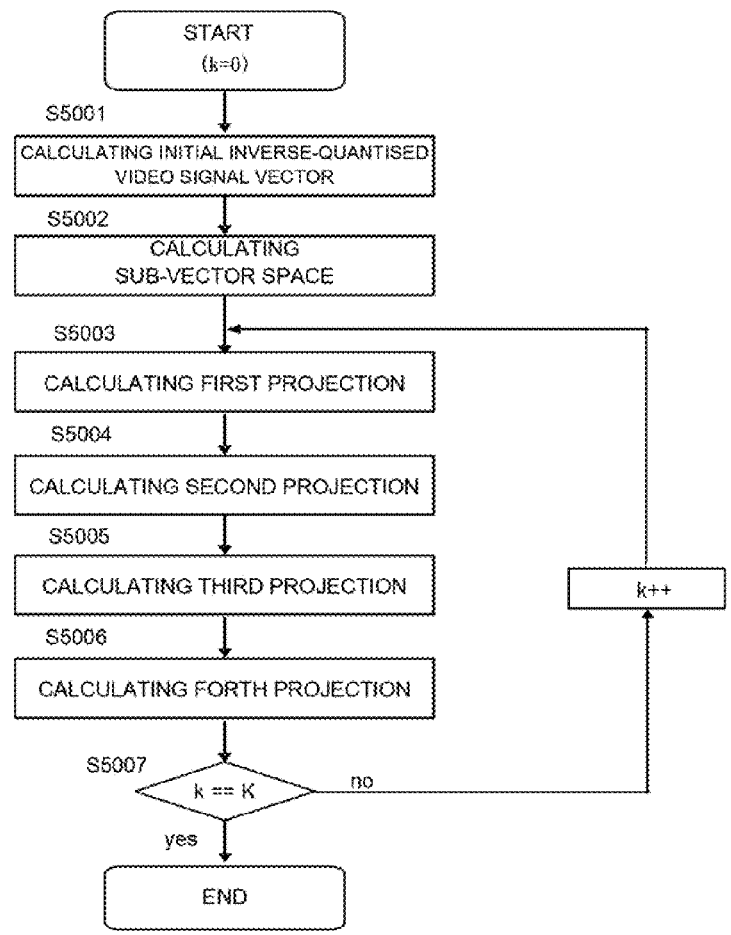
FIG. 13 is a flowchart of the fourth exemplary embodiment.
Figure 14:
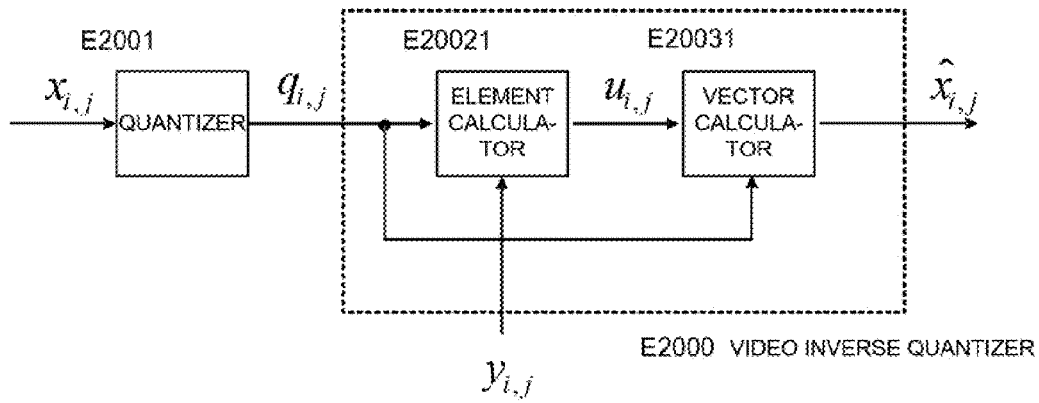
FIG. 14 is another configuration view of the first exemplary embodiment.
Figure 15:
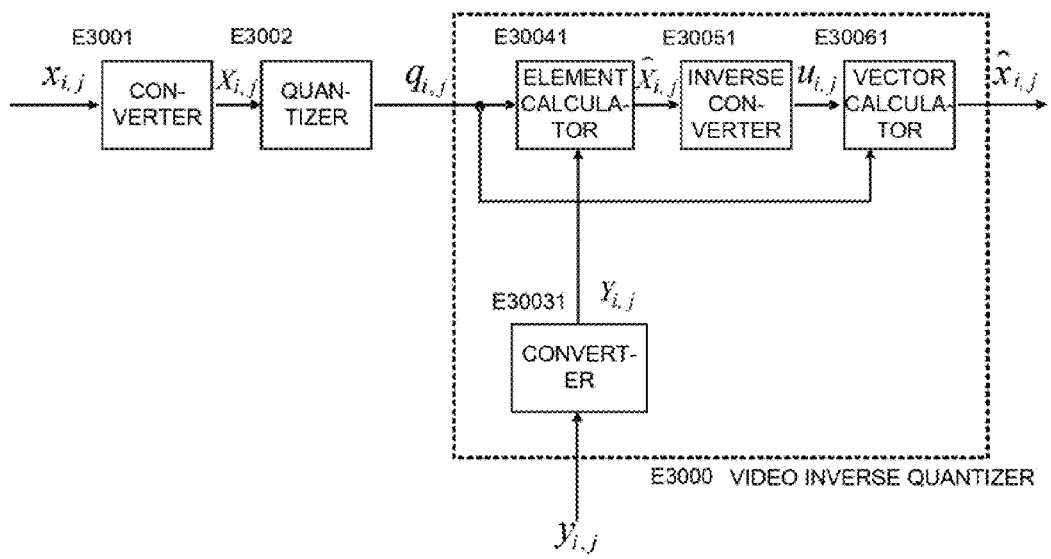
FIG. 15 is another configuration view of the second exemplary embodiment.
Figure 16:
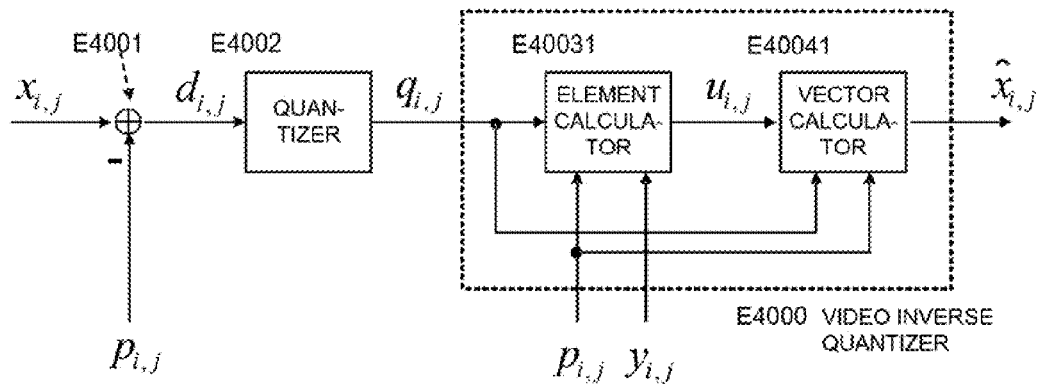
FIG. 16 is another configuration view of the third exemplary embodiment.
Figure 17:
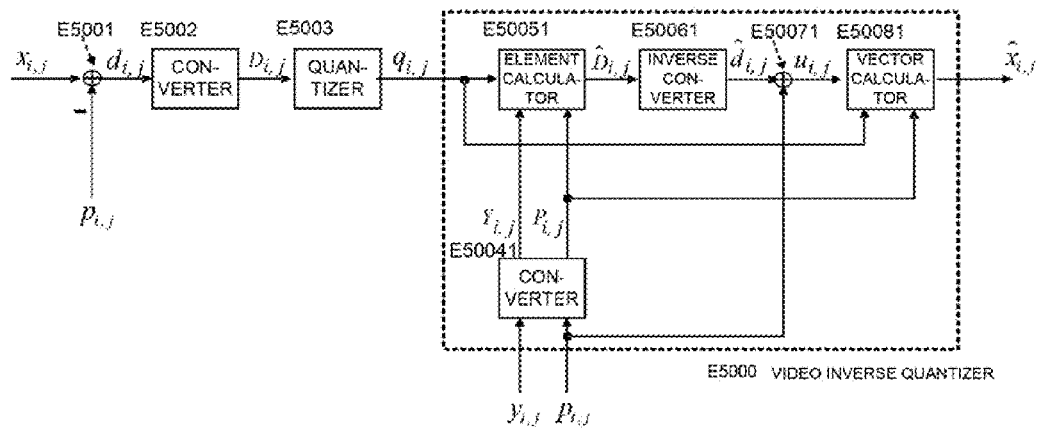
FIG. 17 is another configuration view of the fourth exemplary embodiment.
Figure 18:
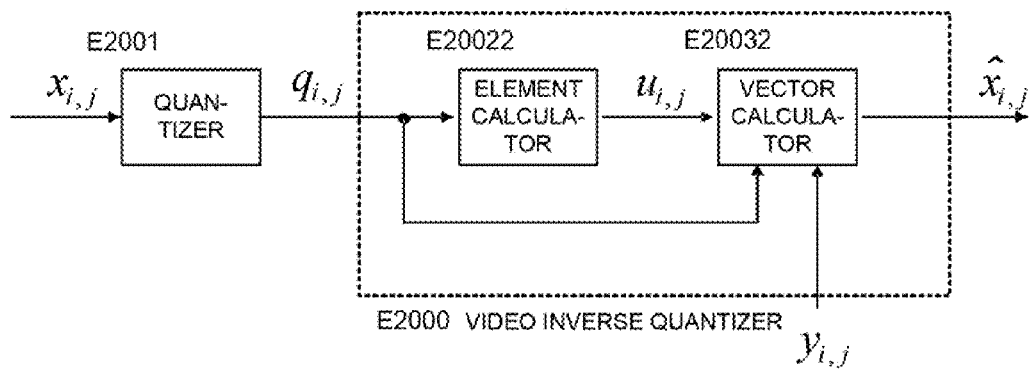
FIG. 18 is another configuration view of the first exemplary embodiment.
Figure 19:
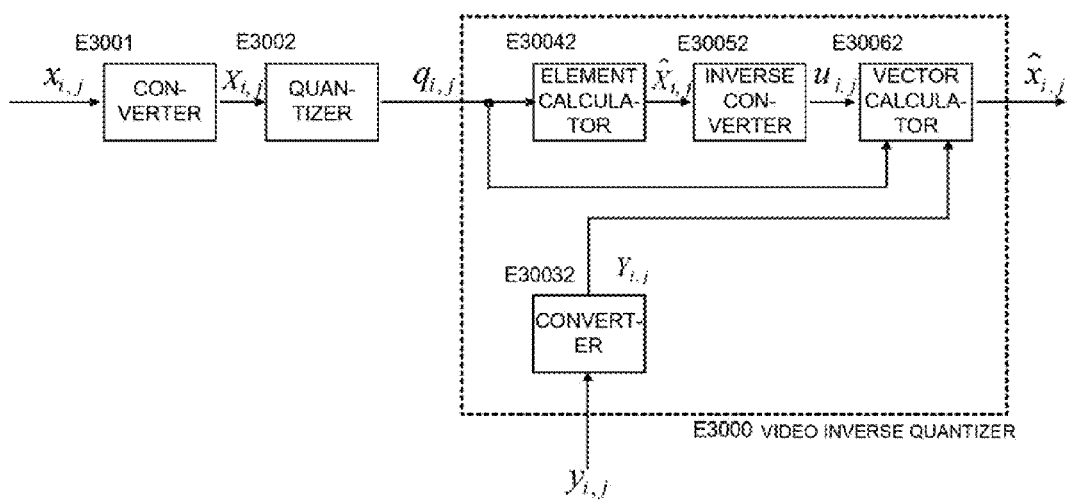
FIG. 19 is another configuration view of the second exemplary embodiment.
Figure 20:
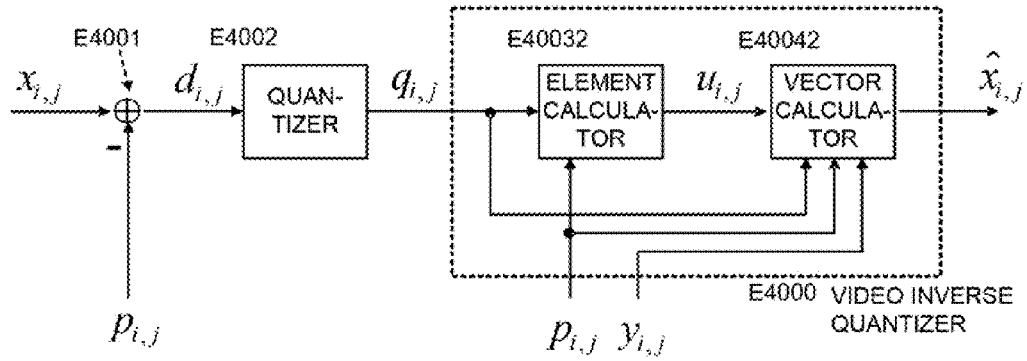
FIG. 20 is another configuration view of the third exemplary embodiment.
Figure 21:
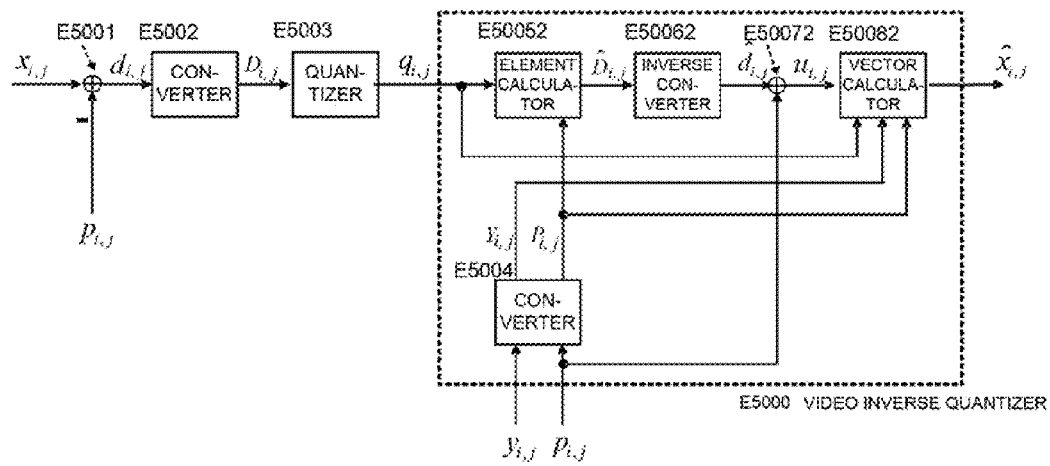
FIG. 21 is another configuration view of the fourth exemplary embodiment.

Continuously, a flow of the process of the present invention will be explained by making a reference to a flowchart of FIG. 13. However, only a flow inside the video inverse quantizer E5000 related to the present invention will be explained.

At first, the counter is reset (k=0) at the moment of starting the process.

In a step S5001, the above-described converter E5004 and element calculator E5005, inverse converter E5006, and adder E5007 calculate the initial inverse-quantized video signal vector u. Continuously, the operation proceeds to a step S5002.

In the step S5002, the above-described vector calculator E5008 calculates the sub-vector space U. Continuously, the operation proceeds to a step S5003.

In the step S5003, the above-described vector calculator E5008 updates the current inverse-quantized video signal vector $u^k$ to the inverse-quantized video signal vector $u^{k+1}$ of which the oscillation is smaller with the above-described first projection. Continuously, the operation proceeds to a step S5004.

In the step S5004, the above-described vector calculator E5008 converts the inverse-quantized video signal vector $u^{k+1}$ obtained by the step S5003 to the frequency region with the above-described second projection. Continuously, the operation proceeds to a step S5005.

In the step S5005, the above-described vector calculator E5008 restricts the inverse-quantized converted coefficient value vector $U^{k+1}$ obtained by the step S5004 within the aforementioned sub-vector space U with the above-described third projection. Continuously, the operation proceeds to a step S5006.

In the step S5006, the above-described vector calculator E5008 projects the inverse-quantized converted coefficient value vector $U^{k+1}$ obtained by the step S5005 to the space region with the above-described fourth projection. Continuously, the operation proceeds to a step S5007.

In the step S5007, it is determined whether the counter k is equal to a predetermined value K. When it is equal, the process is finished. Otherwise, the counter k is incremented by 1 (one), and the operation returns to the step S5003. Additionally, the variable $\lambda$ of the above-described first projection is preferably changed to a smaller positive value at the moment that the operation returns to the step S5003.

After the process is finished, $u^k$ is output as the final inverse-quantized video signal vector $\hat{x}$.

Above, the explanation of the flowchart of the present invention in this exemplary embodiment is finished.

Above, the explanation of this exemplary embodiment is finished.

Fifth Exemplary Embodiment

While respective vector calculators calculated the sub-vector space U more accurately by employing the auxiliary information in the above-described exemplary embodiments 1 to 4, a respect of calculating the sub-vector space U without employing the auxiliary information is also thinkable. As the drawings corresponding to respective exemplary embodiments, FIG. 14, FIG. 15, FIG. 16, and FIG. 17 are shown in the following. In this respect, it is desirable that the aforementioned final inverse-quantized video vector does not shift from the initial inverse-quantized video vector obtained by respective element calculators if possible because the sub-vector space U is not accurate. For this, the initial value of λ of the functional (s, $u^k$, λ) in the aforementioned first projection in respective vector calculators is set to a value smaller than that of the above-described exemplary embodiments 1 to 4.

Further, while respective element calculators calculated the initial inverse-quantized video by employing the auxiliary information in the above-described exemplary embodiments 1 to 4, it is thinkable that the element calculator calculates the initial inverse-quantized video without employing the auxiliary information (by simply employing the inverse quantization). As the drawings corresponding to respective exemplary embodiments, FIG. 18, FIG. 19, FIG. 20, and FIG. 21 are shown in the following. In this respect, it is desirable to shift the initial inverse-quantized video vectors obtained by respective element calculator all the more because the initial inverse-quantized video is not accurate. For this, the initial value of λ of the functional (s, $u^k$, λ) in the aforementioned first projection in each vector calculators is set to a value larger than that of the above-described exemplary embodiments 1 to 4, or the aforementioned number of times of successive repetition is increased.

Further, while the aspect in which the total variation minimization method was utilized in the aforementioned first projection was explained in the above-described exemplary embodiments, the bilateral filtering may be utilized instead of the total variation minimization method. A result $$\hat{I}_{i,j}$$

of the bilateral filtering for a certain element $I_{i,j}$ of the video signal is defined by the following numerical equations.

$$\hat{I}_{i,j} = \frac{1}{W} \sum_{m=-w+i}^{m=i+w} \sum_{n=-w+j}^{n=j+w} G(\sigma_s, |I_{m,n} - I_{i,j}|) \cdot G\left(\sigma_r, \sqrt{(m-i)^2 + (n-j)^2}\right) \cdot I_{m,n} \quad (52)$$

$$G(\sigma, x) = \frac{1}{2\pi\sigma^2} \exp\left(-\frac{x^2}{2\sigma^2}\right) \quad (53)$$

$$W = \sum_{m=-w+i}^{m=i+w} \sum_{n=-w+j}^{n=j+w} G(\sigma_s, |I_{m,n} - I_{i,j}|) \cdot G\left(\sigma_r, \sqrt{(m-i)^2 + (n-j)^2}\right) \quad (54)$$

Where each of $\sigma_s$ and $\sigma_r$ is a parameter of the bilateral filter for deciding the form of the two-dimensional Gaussian kernel of the numerical equation (52), and w is a parameter for deciding a window size of the bilateral filter. In particular, it is enough to set $\sigma_r$ responding to the quantized noise that is estimated, and the value thereof is desirably lessened in a gradual manner at the moment of the aforementioned successive repetition.

Figure 22:
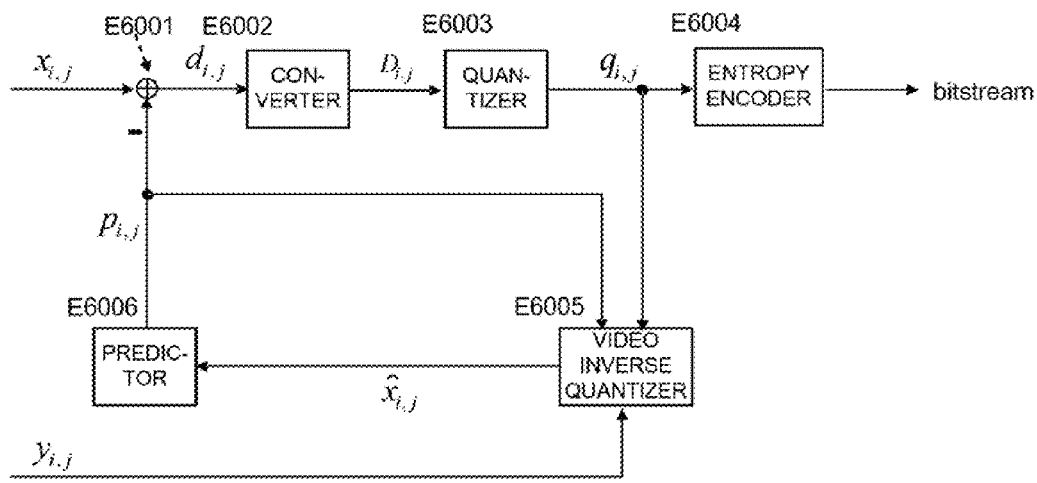
FIG. 22 is a configuration view of a video encoder employing a video inverse quantizer.

Further, in the video encoder for encoding the quantized values, the above-described video inverse quantization method can be utilized as a decoding means for locally decoding the above video signals. A configuration view of the video encoder utilizing the video inverse quantizer of the exemplary embodiment 4 is shown in FIG. 22 as one example.

Figure 23:
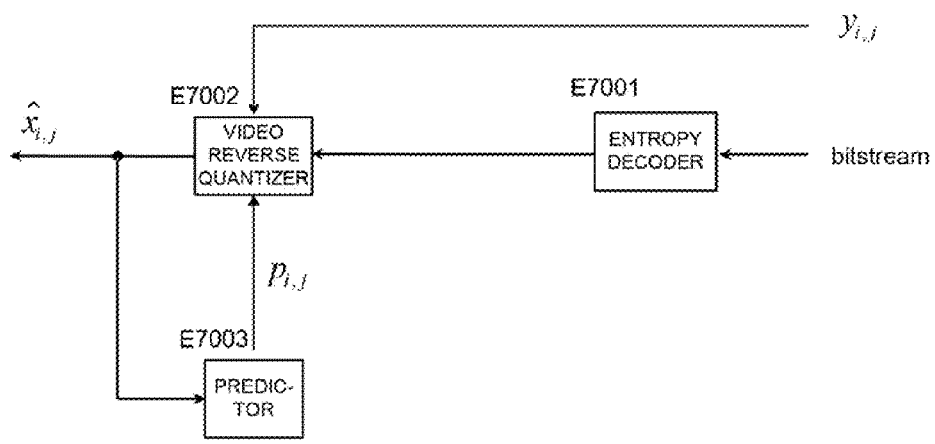
FIG. 23 is a configuration view of a video decoder employing the video inverse quantizer.

Further, in the video decoding method of decoding the quantized values, the above-described video inverse quantization method can be utilized as a decoding means for decoding the above video signals. A configuration view of the video decoder utilizing the video inverse quantizer of the exemplary embodiment 4 is shown in FIG. 23 as one example.

In addition, while it is possible in the above-described exemplary embodiments, to configure with hardware in the above-described exemplary embodiments, as apparent from the above-described explanation, it is also possible to realize with a computer program.

Figure 24:
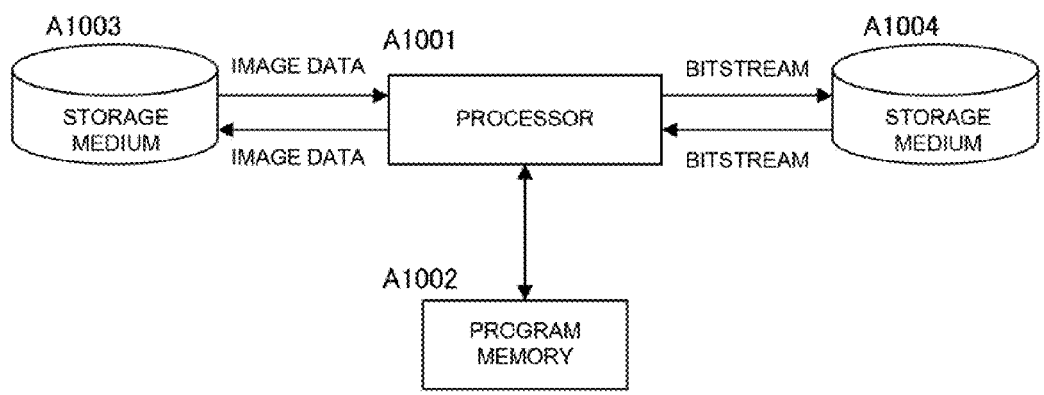
FIG. 24 is a configuration view of an information processing device of this exemplary embodiment.

The information processing system shown in FIG. 24 is comprised of a processor A1001, a program memory A1002, and storage mediums A1003 and A1004. The storage mediums A1003 and A1004 may be a separate storage medium, respectively, and may be a storage region that is comprised of an identical storage medium. The magnetic storage medium such as a hard disk can be employed as the storage medium.

The present invention updates the inverse-quantized video signal vector (the initial inverse-quantized video signal vector) that has been inverse-quantized by the related arts element by element to the inverse-quantized video signal vector (the final inverse-quantized video signal vector) such that the oscillation of the above video signal vector becomes small. In particular, the present invention accurately qualifies the sub-vector space in which the original video signal vector exists by employing the quantized values to be inputted, the auxiliary information, and the aforementioned conditional probability density function, and calculates the aforementioned final inverse-quantized video signal vector within the above sub-vector space.

The present invention is capable of providing the high-quality video inverse quantization method that makes it possible to overcome the basic problem of the related arts that "the square error is locally enlarged in return for a reduction in the mean square error of the decoded video signal vector, and it is conspicuous as local deterioration" while suppressing the blur of the aforementioned final inverse-quantized video signal vector. As a reference, specific examples of the effect of the present invention are shown below.

Figure 25:
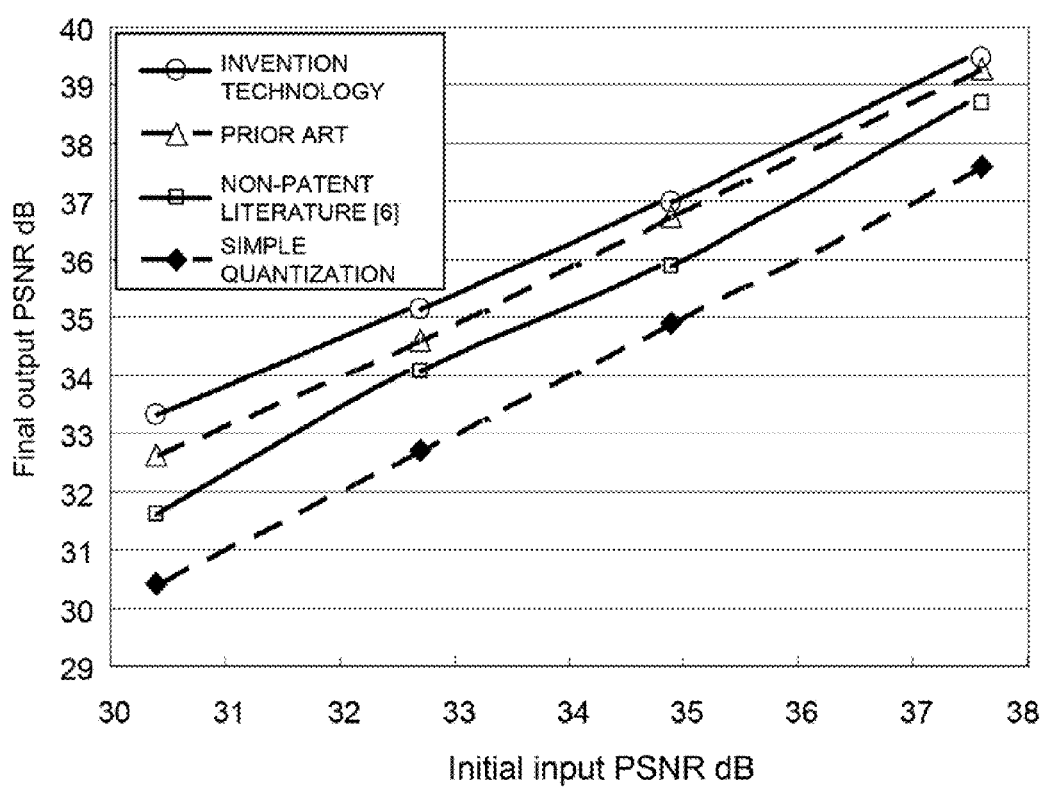
FIG. 25 is a view for explaining a specific example of the effects in this exemplary embodiment.

FIG. 25 shows a result of having inverse-quantized the video subjected to the JPEG compression with the simple inverse quantization (normal JPEG expansion), the technology of the Non-patent literature 6, the above-described related art, and the above-described present invention technology of the exemplary embodiment 2, respectively. A lateral axis of FIG. 25 is PSNR (Peak Signal—Noise Ratio) of the normal JPEG expansion, and a longitudinal axis is PSNR at the time of having inverse-quantized the video with the normal JPEG expansion and the aforementioned respective technologies. It can be confirmed that the present invention technology is higher in PSNR than the related art owing to suppression of not only the local deterioration that occurs in the related art, but also the video deterioration caused by the approximation calculation. Further, it can be confirmed that the present invention technology is higher in PSNR than the non-patent literature 6 because it accurately qualifies the sub-vector space in which the original video signal vector exists.

Further, the present invention is capable of providing the higher-quality video inverse quantization method by calculating the aforementioned final inverse-quantized video signal vector in such a manner that when the auxiliary information is the video signal vector of the frame that neighbors the video signal vector, being a target of the inverse quantization, in the time direction, the corresponding element of the aforementioned final inverse-quantized video signal vector takes the value close to the value of the element of the aforementioned auxiliary information.

Further, the present invention is utilized as the local decoding means of the already-encoded video signals in the video encoding method of encoding the quantized values, thereby making possible to provide the higher-quality video encoding method.

Further, the present invention is utilized as the decoding means of the quantized values in the video decoding method of decoding the quantized values, thereby making possible to provide the higher-quality video decoding method.

Above, while the present invention has been particularly shown and described with reference to preferred exemplary embodiments and aspects, the present invention is not limited to the above mentioned exemplary embodiments. It will be understood by those of ordinary skill in the art that various changes in form and details may be made therein without departing from the spirit and scope of the present invention as defined by the claims.

The following supplementary notes are described.

(Supplementary note 1) An inverse quantization method of inverse-quantizing a plurality of quantized values as a set, and obtaining a set of a plurality of inverse-quantized values, comprising:
  obtaining a scope of potential inverse-quantized values for each quantized value by employing at least signals other than said quantized value; and
  obtaining a set of preliminary inverse-quantized values for which a total variation norm becomes minimized as said set of inverse-quantized values, within a scope of said potential inverse-quantized values.

(Supplementary note 2) An inverse quantization method according to supplementary note 1, comprising:
  calculating the preliminary inverse-quantized value of each quantized value of said plurality of quantized values in an element unit by employing said plurality of quantized values and signals other than said quantized value; and
  obtaining a scope of potential inverse-quantized values for each quantized value by employing said plurality of quantized values and signals other than said quantized value, and obtaining a set of the preliminary inverse-quantized values for which the total variation norm becomes minimized as said set of inverse-quantized values, within a scope of said potential inverse-quantized values with a set of the preliminary inverse-quantized values calculated in said element unit as a starting point.

(Supplementary note 3) An inverse quantization method according to supplementary note 1, comprising:
  calculating the preliminary inverse-quantized value of each quantized value of said plurality of quantized values in an element unit by employing said plurality of quantized values; and
  obtaining a scope of potential inverse-quantized values for each quantized value by employing said plurality of quantized values and signals other than said quantized value, and obtaining a set of the preliminary inverse-quantized values for which the total variation norm becomes minimized as said set of inverse-quantized values, within a scope of said potential inverse-quantized values with a set of the preliminary inverse-quantized values calculated in said element unit as a starting point.

(Supplementary note 4) An inverse quantization method of inverse-quantizing a plurality of quantized values as a set, and obtaining a set of a plurality of inverse-quantized values, comprising:
  calculating a preliminary inverse-quantized value of each quantized value of said plurality of quantized values in an element unit by employing said plurality of quantized values, and signals other than said quantized value; and
  obtaining a scope of potential inverse-quantized values for each quantized value by employing said plurality of quantized values, and obtaining a set of the preliminary inverse-quantized values for which a total variation norm becomes minimized as said set of inverse-quantized values, within a scope of said potential inverse-quantized values with a set of the preliminary inverse-quantized values calculated in said element unit as a starting point.

(Supplementary note 5) An inverse quantization method according to one of supplementary note 1 to supplementary note 4, comprising, when the signals other than a certain said quantized value are included in a scope of the potential inverse-quantized values for the corresponding quantized value, incorporating the preliminary inverse-quantized values having a small difference with the signals other than the above said quantized value into a set of said plurality of inverse-quantized values.

(Supplementary note 6) An encoding method of encoding a plurality of quantized values, employing an inverse quantization method of inverse-quantizing a plurality of quantized values as a set, and obtaining a set of a plurality of inverse-quantized values, wherein said inverse quantization method:
  obtains a scope of potential inverse-quantized values for each quantized value by employing at least signals other than of said quantized value; and
  obtains a set of preliminary inverse-quantized values for which a total variation norm becomes minimized as said set of inverse-quantized values, within a scope of said potential inverse-quantized values.

(Supplementary note 7) An encoding method of encoding a plurality of quantized values, employing an inverse quantization method of inverse-quantizing a plurality of quantized values as a set, and obtaining a set of a plurality of inverse-quantized values, wherein said inverse quantization method:
  calculates a preliminary inverse-quantized value of each quantized value of said plurality of quantized values in an element unit by employing said plurality of quantized values and signals other than said quantized value; and
  obtains a scope of potential inverse-quantized values for each quantized value by employing said plurality of quantized values, and obtains a set of the preliminary inverse-quantized values for which a total variation norm becomes minimized as said set of inverse-quantized values, within a scope of said potential inverse-quantized values with a set of the preliminary inverse-quantized values calculated in said element unit as a starting point.

(Supplementary note 8) A decoding method of decoding a plurality of quantized values, employing an inverse quantization method of inverse-quantizing a plurality of quantized values as a set, and obtaining a set of a plurality of inverse-quantized values, wherein said inverse quantization method:
  obtains a scope of potential inverse-quantized values for each quantized value by employing at least signals other than said quantized value; and
  obtains a set of preliminary inverse-quantized values for which a total variation norm becomes minimized as said set of inverse-quantized values, within a scope of said potential inverse-quantized values.

(Supplementary note 9) A decoding method of decoding a plurality of quantized values, employing an inverse quantization method of inverse-quantizing a plurality of quantized values as a set, and obtaining a set of a plurality of inverse-quantized values, wherein said inverse quantization method:
calculates a preliminary inverse-quantized value of each quantized value of said plurality of quantized values in an element unit by employing said plurality of quantized values and signals other than said quantized value; and
obtains a scope of potential inverse-quantized values for each quantized value by employing said plurality of quantized values, and obtains a set of the preliminary inverse-quantized values for which a total variation norm becomes minimized as said set of inverse-quantized values, within a scope of said potential inverse-quantized values with a set of the preliminary inverse-quantized values calculated in said element unit as a starting point.

(Supplementary note 10) A video inverse quantization method of, from a quantized value vector corresponding to a video vector, being a current target of processing, calculating an inverse-quantized video vector thereof, comprising:
a video element calculation step of calculating an initial inverse-quantized video vector in an element unit by employing an element of another video vector having a correlation with the video vector, being said target of processing, and an element of said quantized value vector; and
a video vector calculation step of, as said inverse-quantized video vector, calculating a preliminary inverse-quantized video vector for which a total variation norm becomes minimized from an aggregation of preliminary inverse-quantized video vectors that are decided by another video vector having a correlation with the video vector, being said target of processing, and said quantized value vector with the initial inverse-quantized video vector calculated by said video element calculation step as a starting point.

(Supplementary note 11) A video inverse quantization method of, from a quantized value vector corresponding to a video vector, being a current target of processing, calculating an inverse-quantized video vector thereof, comprising:
a video element calculation step of calculating an initial inverse-quantized video vector in an element unit by employing anelement of another video vector having a correlation with the video vector, being said target of processing, and an element of said quantized value vector; and
a video vector calculation step of, as said inverse-quantized video vector, calculating a preliminary inverse-quantized video vector for which a total variation norm becomes minimized from an aggregation of preliminary inverse-quantized video vectors that are decided by said quantized value vector with the initial inverse-quantized video vector calculated by said video element calculation step as a starting point.

(Supplementary note 12) A video inverse quantization method of, from a quantized value vector corresponding to a video vector, being a current target of processing, calculating an inverse-quantized video vector thereof, comprising:
a video element calculation step of calculating an initial inverse-quantized video vector in an element unit by employing an element of said quantized value vector; and
a video vector calculation step of, as said inverse-quantized video vector, calculating a preliminary inverse-quantized video vector for which a total variation norm becomes minimized from an aggregation of preliminary inverse-quantized video vectors that are decided by another video vector having a correlation with the video vector, being said target of processing, and said quantized value vector with the initial inverse-quantized video vector calculated by said video element calculation step as a starting point.

(Supplementary note 13) A video inverse quantization method according to one of supplementary note 10 to supplementary note 12, wherein when the element of another video vector having said correlation is included in a range of the elements of said aggregation of preliminary inverse-quantized video vectors corresponding to said video vector, said video vector calculation step calculates, as said inverse-quantized video vector, the preliminary inverse-quantized video vector of which a difference with the element of another video vector having said correlation is smaller with regard to the above element.

(Supplementary note 14) A video encoding method of encoding a quantized value vector, employing a video inverse quantization method of, from a quantized value vector corresponding to a video vector, being a current target of processing, calculating an inverse-quantized video vector thereof, wherein said video inverse quantization method comprises:
a video element calculation step of calculating an initial inverse-quantized video vector, being a target of processing, in an element unit by employing an element of another video vector having a correlation with the video vector, being said target of processing, and an element of said quantized value vector; and
a video vector calculation step of, as said inverse-quantized video vector, calculating a preliminary inverse-quantized video vector for which a total variation norm becomes minimized from a vector space that is decided by another video vector having a correlation with the video vector, being said target of processing, and said quantized value vector with the initial inverse-quantized video vector calculated by said video element calculation step as a starting point.

(Supplementary note 15) A video decoding method of decoding a quantized value vector, employing a video inverse quantization method of, from a quantized value vector corresponding to a video vector, being a current target of processing, calculating an inverse-quantized video vector thereof, wherein said video inverse quantization method comprises:
a video element calculation step of calculating an initial inverse-quantized video vector, being a target of processing, in an element unit by employing an element of another video vector having a correlation with the video vector, being said target of processing, and an element of said quantized value vector; and
a video vector calculation step of, as said inverse-quantized video vector, calculating a preliminary inverse-quantized video vector for which a total variation norm becomes minimized from a vector space that is decided by another video vector having a correlation with the video vector, being said target of processing, and said quantized value vector with the initial inverse-quantized video vector calculated by said video element calculation step as a starting point.

(Supplementary note 16) An inverse quantization device for inverse-quantizing a plurality of quantized values as a set, and obtaining a set of a plurality of inverse-quantized values, comprising a decoding means that obtains a scope of potential inverse-quantized values for each quantized value by employing at least signals other than said quantized value, and obtains a set of preliminary inverse-quantized values for which a total variation norm becomes minimized as said set of inverse-quantized values, within a scope of said potential inverse-quantized values.

(Supplementary note 17) An inverse quantization device according to supplementary note 16, wherein said decoding means comprises:
  a means that calculates the preliminary inverse-quantized value of each quantized value of said plurality of quantized values in an element unit by employing said plurality of quantized values and signals other than said quantized value, and
  a means that obtains a scope of potential inverse-quantized values for each quantized value by employing said plurality of quantized values and signals other than said quantized value, and obtains a set of the preliminary inverse-quantized values for which the total variation norm becomes minimized as said set of inverse-quantized values, within a scope of said potential inverse-quantized values with a set of the preliminary inverse-quantized values calculated in said element unit as a starting point.

(Supplementary note 18) An inverse quantization device according to supplementary note 16, wherein said decoding means comprises:
  a means that calculates the preliminary inverse-quantized value of each quantized value of said plurality of quantized values in an element unit by employing said plurality of quantized values; and
  a means that obtains a scope of potential inverse-quantized values for each quantized value by employing said plurality of quantized values and signals other than said quantized value, and obtains a set of the preliminary inverse-quantized values for which the total variation norm becomes minimized as said set of inverse-quantized values, within a scope of said potential inverse-quantized values with a set of the preliminary inverse-quantized values calculated in said element unit as a starting point.

(Supplementary note 19) An inverse quantization device for inverse-quantizing a plurality of quantized values as a set, and obtaining a set of a plurality of inverse-quantized values, comprising a decoding means that calculates a preliminary inverse-quantized value of each quantized value of said plurality of quantized values in an element unit by employing said plurality of quantized values, and signals other than said quantized value, obtains a scope of potential inverse-quantized values for each quantized value by employing said plurality of quantized values, and obtains a set of the preliminary inverse-quantized values for which a total variation norm becomes minimized as said set of inverse-quantized values, within a scope of said potential inverse-quantized values with a set of the preliminary inverse-quantized values calculated in said element unit as a starting point.

(Supplementary note 20) An inverse quantization device according to one of supplementary note 16 to supplementary note 19, wherein when the signals other than a certain said quantized value are included in a scope of the potential inverse-quantized values for the corresponding quantized value, said decoding means incorporates the preliminary inverse-quantized values having a small difference with the signals other than the above said quantized value into a set of said plurality of inverse-quantized values.

(Supplementary note 21) An encoding device for encoding a plurality of quantized values, comprising an inverse quantization device for inverse-quantizing a plurality of quantized values as a set, and obtaining a set of a plurality of inverse-quantized values, wherein said inverse quantization device comprises a means that obtains a scope of potential inverse-quantized values each quantized value by employing at least signals other than said quantized value, and obtains a set of preliminary inverse-quantized values for which a total variation norm becomes minimized as said set of inverse-quantized values, within a scope of said potential inverse-quantized values.

(Supplementary note 22) An encoding device for encoding a plurality of quantized values, comprising an inverse quantization device for inverse-quantizing a plurality of quantized values as a set, and obtaining a set of a plurality of inverse-quantized values, wherein said inverse quantization device comprises a means that calculates a preliminary inverse-quantized value of each quantized value of said plurality of quantized values in an element unit by employing said plurality of quantized values and signals other than said quantized value, obtains a scope of potential inverse-quantized values for each quantized value by employing said plurality of quantized values, and obtains a set of the preliminary inverse-quantized values for which a total variation norm becomes minimized as said set of inverse-quantized values, within a scope of said potential inverse-quantized values with a set of the preliminary inverse-quantized values calculated in said element unit as a starting point.

(Supplementary note 23) A decoding device for decoding a plurality of quantized values, comprising an inverse quantization device for inverse-quantizing a plurality of quantized values as a set, and obtaining a set of a plurality of inverse-quantized values, wherein said inverse quantization device comprises a means that obtains a scope of potential inverse-quantized values for each quantized value by employing at least signals other than said quantized value; and obtains a set of preliminary inverse-quantized values for which a total variation norm becomes minimized as said set of inverse-quantized values, within a scope of said potential inverse-quantized values.

(Supplementary note 24) A decoding device for decoding a plurality of quantized values, comprising an inverse quantization device for inverse-quantizing a plurality of quantized values as a set, and obtaining a set of a plurality of inverse-quantized values, wherein said inverse quantization device comprises a means that calculates a preliminary inverse-quantized value of each quantized value of said plurality of quantized values in an element unit by employing said plurality of quantized values and signals other than said quantized value, obtains a scope of potential inverse-quantized values for each quantized value by employing said plurality of quantized values, and obtains a set of the preliminary inverse-quantized values for which a total variation norm becomes minimized as said set of inverse-quantized values, within a scope of said potential inverse-quantized values with a set of the preliminary inverse-quantized values calculated in said element unit as a starting point.

(Supplementary note 25) A video inverse quantization device for, from a quantized value vector corresponding to a video vector, being a current target of processing, calculating an inverse-quantized video vector thereof, comprising:
  a video element calculation means that calculates an initial inverse-quantized video vector in an element unit by employing an element of another video vector having a correlation with the video vector, being said target of processing, and an element of said quantized value vector; and
  a video vector calculation means that calculates, as said inverse-quantized video vector, a preliminary inverse-quantized video vector for which a total variation norm becomes minimized from an aggregation of preliminary inverse-quantized video vectors that are decided by another video vector having a correlation the video vector, being said target of processing, and said quantized value vector with the initial inverse-quantized video vector calculated by said video element calculation means as a starting point.

(Supplementary note 26) A video inverse quantization device for, from a quantized value vector corresponding to a video vector, being a current target of processing, calculating an inverse-quantized video vector thereof, comprising:
- a video element calculation means that calculates an initial inverse-quantized video vector in an element unit by employing an element of another video vector having a correlation with the video vector, being said target of processing, and an element of said quantized value vector; and
- a video vector calculation means that calculates, as said inverse-quantized video vector, a preliminary inverse-quantized video vector for which a total variation norm becomes minimized from an aggregation of preliminary inverse-quantized video vectors that are decided by said quantized value vector with the initial inverse-quantized video vector calculated by said video element calculation means as a starting point.

(Supplementary note 27) A video inverse quantization device for, from a quantized value vector corresponding to a video vector, being a current target of processing, calculating an inverse-quantized video vector thereof, comprising:
- a video element calculation means that calculates an initial inverse-quantized video vector in an element unit by employing an element of said quantized value vector; and
- a video vector calculation means that calculates, as said inverse-quantized video vector, a preliminary inverse-quantized video vector for which a total variation norm becomes minimized from an aggregation of preliminary inverse-quantized video vectors that are decided by another video vector having a correlation with the video vector, being said target of processing, and said quantized value vector with the initial inverse-quantized video vector calculated by said video element calculation means as a starting point.

(Supplementary note 28) A video inverse quantization device according to one of supplementary note 25 to supplementary note 27, wherein when the element of another video vector having said correlation is included in a range of the elements of said aggregation of preliminary inverse-quantized video vectors corresponding to said video vector, said video vector calculation means calculates, as said inverse-quantized video vector, the preliminary inverse-quantized video vector of which a difference with the element of another video vector having said correlation is smaller with regard to the above element.

(Supplementary note 29) A video encoding device for encoding a quantized value vector, comprising a video inverse quantization device for, from a quantized value vector corresponding to a video vector, being a current target of processing, calculating an inverse-quantized video vector thereof, wherein said video inverse quantization device comprises:
- a video element calculation means that calculates an initial inverse-quantized video vector, being a target of processing, in an element unit by employing an element of another video vector having a correlation with the video vector, being said target of processing, and an element of said quantized value vector; and
- a video vector calculation means that calculates, as said inverse-quantized video vector, a preliminary inverse-quantized video vector for which a total variation norm becomes minimized from a vector space that is decided by another video vector having a correlation with the video vector, being said target of processing, and said quantized value vector with the initial inverse-quantized video vector calculated by said video element calculation means as a starting point.

(Supplementary note 30) A video decoding device for decoding a quantized value vector, comprising a video inverse quantization device for, from a quantized value vector corresponding to a video vector, being a current target of processing, calculating an inverse-quantized video vector thereof, wherein said video inverse quantization device comprises:
- a video element calculation means that calculates an initial inverse-quantized video vector, being a target of processing, in an element unit by employing an element of another video vector having a correlation with the video vector, being said target of processing, and an element of said quantized value vector; and
- a video vector calculation means that calculates, as said inverse-quantized video vector, a preliminary inverse-quantized video vector for which a total variation norm becomes minimized from a vector space that is decided by another video vector having a correlation with the video vector, being said target of processing, and said quantized value vector with the initial inverse-quantized video vector calculated by said video element calculation means as a starting point.

(Supplementary note 31) An inverse quantization program for inverse-quantizing a plurality of quantized values as a set, and obtaining a set of a plurality of inverse-quantized values, causing an information processing device to execute:
- a process of obtaining a scope of potential inverse-quantized values for each quantized value by employing at least signals other than said quantized value; and
- a process of obtaining a set of preliminary inverse-quantized values for which a total variation norm becomes minimized as said set of inverse-quantized values, within a scope of said potential inverse-quantized values.

(Supplementary note 32) An inverse quantization program for inverse-quantizing a plurality of quantized values as a set, and obtaining a set of a plurality of inverse-quantized values, causing an information processing device to execute:
- a process of calculating a preliminary inverse-quantized value of each quantized value of said plurality of quantized values in an element unit by employing said plurality of quantized values and signals other than said quantized value, and
- a process of obtaining a scope of potential inverse-quantized values for each quantized value by employing said plurality of quantized values, and obtaining a set of the preliminary inverse-quantized values for which a total variation norm becomes minimized as said set of inverse-quantized values, within a scope of said potential inverse-quantized values with a set of the preliminary inverse-quantized values calculated in said element unit as a starting point.

(Supplementary note 33) An encoding program for encoding a plurality of quantized values, comprising an inverse quantization process of inverse-quantizing a plurality of quantized values as a set, and obtaining a set of a plurality of inverse-quantized values, wherein said inverse quantization process causes an information processing device to execute:
- a process of obtaining a scope of potential inverse-quantized values for each quantized value by employing at least signals other than said quantized value; and a process of obtaining a set of preliminary inverse-quantized values for which a total variation norm becomes minimized as said set of inverse-quantized values, within a scope of said potential inverse-quantized values.

(Supplementary note 34) An encoding program for encoding a plurality of quantized values, comprising an inverse quantization process of inverse-quantizing a plurality of quantized values as a set, and obtaining a set of a plurality of inverse-quantized values, wherein said inverse quantization process causes an information processing device to execute:
    a process of calculating a preliminary inverse-quantized value of each quantized value of said plurality of quantized values in an element unit by employing said plurality of quantized values and signals other than said quantized value; and
    a process of obtaining a scope of potential inverse-quantized values for each quantized value by employing said plurality of quantized values, and obtaining a set of the preliminary inverse-quantized values for which a total variation norm becomes minimized as said set of inverse-quantized values, within a scope of said potential inverse-quantized values with a set of the preliminary inverse-quantized values calculated in said element unit as a starting point.

(Supplementary note 35) A decoding program for decoding a plurality of quantized values, comprising an inverse quantization process of inverse-quantizing a plurality of quantized values as a set, and obtaining a set of a plurality of inverse-quantized values, wherein said inverse quantization process causes an information processing device to execute:
    a process of obtaining a scope of potential inverse-quantized values for each quantized value by employing at least signals other than said quantized value; and
    a process of obtaining a set of preliminary inverse-quantized values for which a total variation norm becomes minimized as said set of inverse-quantized values, within a scope of said potential inverse-quantized values.

(Supplementary note 36) A decoding program for decoding a plurality of quantized values, comprising an inverse quantization process of inverse-quantizing a plurality of quantized values as a set, and obtaining a set of a plurality of inverse-quantized values, wherein said inverse quantization process causes an information processing device to execute:
    a process of calculating a preliminary inverse-quantized value of each quantized value of said plurality of quantized values in an element unit by employing said plurality of quantized values and signals other than said quantized values; and
    a process of obtaining a scope of potential inverse-quantized values for each quantized value by employing said plurality of quantized values, and obtaining a set of the preliminary inverse-quantized values for which a total variation norm becomes minimized as said set of inverse-quantized values, within a scope of said potential inverse-quantized values with a set of the preliminary inverse-quantized values calculated in said element unit as a starting point.

(Supplementary note 37) A video inverse quantization program for, from a quantized value vector corresponding to a video vector, being a current target of processing, calculating an inverse-quantized video vector thereof, said video inverse quantization program causing an information processing device to execute:
    a video element calculation process of calculating an initial inverse-quantized video vector in an element unit by employing an element of another video vector having a correlation with the video vector, being said target of processing, and an element of said quantized value vector; and
    a video vector calculation process of, as said inverse-quantized video vector, calculating a preliminary inverse-quantized video vector for which a total variation norm becomes minimized from an aggregation of preliminary inverse-quantized video vectors that are decided by another video vector having a correlation with the video vector, being said target of processing, and said quantized value vector with the initial inverse-quantized video vector calculated by said video element calculation process as a starting point.

(Supplementary note 38) A video inverse quantization program for, from a quantized value vector corresponding to a video vector, being a current target of processing, calculating an inverse-quantized video vector thereof, said video inverse quantization program causing an information processing device to execute:
    a video element calculation process of calculating an initial inverse-quantized video vector in an element unit by employing an element of another video vector having a correlation with the video vector, being said target of processing, and an element of said quantized value vector; and
    a video vector calculation process of, as said inverse-quantized video vector, calculating a preliminary inverse-quantized video vector for which a total variation norm becomes minimized from an aggregation of preliminary inverse-quantized video vectors that are decided by said quantized value vector with the initial inverse-quantized video vector calculated by said video element calculation process as a starting point.

(Supplementary note 39) A video inverse quantization program for, from a quantized value vector corresponding to a video vector, being a current target of processing, calculating an inverse-quantized video vector thereof, said video inverse quantization program causing an information processing device to execute:
    a video element calculation process of calculating an initial inverse-quantized video vector in an element unit by employing an element of said quantized value vector; and
    a video vector calculation process of, as said inverse-quantized video vector, calculating a preliminary inverse-quantized video vector for which a total variation norm becomes minimized from an aggregation of preliminary inverse-quantized video vectors that are decided by another video vector having a correlation with the video vector, being said target of processing, and said quantized value vector with the initial inverse-quantized video vector calculated by said video element calculation process as a starting point.

(Supplementary note 40) A video encoding program for encoding a quantized value vector, comprising a video inverse quantization process of, from a quantized value vector corresponding to a video vector, being a current target of processing, calculating an inverse-quantized video vector thereof, wherein said video inverse quantization process causes an information processing device to execute:
    a video element calculation process of calculating an initial inverse-quantized video vector, being a target of processing, in an element unit by employing an element of another video vector having a correlation with the video vector, being said target of processing, and an element of said quantized value vector; and a video vector calculation process of, as said inverse-quantized video vector, calculating a preliminary inverse-quantized video vector for which a total variation norm becomes minimized from a vector space that are decided by another video vector having a correlation with the video vector, being said target of processing, and said quantized value vector with the initial inverse-quantized video vector calculated by said video element calculation process as a starting point.

(Supplementary note 41) A video decoding program for decoding a quantized value vector, comprising a video inverse quantization process of, from a quantized value vector corresponding to a video vector, being a current target of processing, calculating an inverse-quantized video vector thereof, wherein said video inverse quantization process causes an information processing device to execute:

a video element calculation process of calculating an initial inverse-quantized video vector, being a target of processing, in an element unit by employing an element of another video vector having a correlation with the video vector, being said target of processing, and an element of said quantized value vector; and a video vector calculation process of, as said inverse-quantized video vector, calculating a preliminary inverse-quantized video vector for which a total variation norm becomes minimized from a vector space that are decided by another video vector having a correlation with the video vector, being said target of processing, and said quantized value vector with the initial inverse-quantized video vector calculated by said video element calculation process as a starting point.

REFERENCE SIGNS LIST

E2000 video inverse quantizer
E2001 quantizer
E2002 element calculator
E2003 vector calculator

The invention claimed is:

1. An inverse quantization method of inverse-quantizing a plurality of quantized values as a set, and obtaining a set of a plurality of inverse-quantized values, of a processor programmed to perform the inverse quantization method, the inverse quantization method comprising:

calculating a preliminary inverse-quantized value of each quantized value of said plurality of quantized values element-by-element by employing said plurality of quantized values; and obtaining a potential range of an inverse-quantized value for each quantized value by employing said plurality of quantized values, a signal other than said quantized value and a conditional probability density function, and obtaining a set of the preliminary inverse-quantized values that attains a minimum total variation norm and lies in a plurality of said potential ranges of inverse-quantized values by employing said set of the preliminary inverse-quantized values calculated element-by-element as initial inverse-quantized value, wherein said plurality of quantized values are calculated by quantizing a plurality of elements x, said signal other than said quantized value is the signal y that has a correlation with said plurality of elements x, and said conditional probability density function is the conditional probability density function $f_{x|y}$ that corresponds to said correlation.

2. The inverse quantization method according to claim 1, comprising:

calculating the preliminary inverse-quantized value of each quantized value of said plurality of quantized values element-by-element by employing said plurality of quantized values and a signal other than said quantized value; and obtaining a potential range of an inverse-quantized value for each quantized value by employing said plurality of quantized values and signal other than said quantized value, and obtaining a set of the preliminary inverse-quantized values that attains the minimum total variation norm and lies in a plurality of said potential ranges of inverse-quantized values by employing said preliminary inverse-quantized values calculated element-by-element as initial inverse-quantized values.

3. The inverse quantization method according to claim 1, comprising, when said signal other than said plurality of quantized values lies in said potential range of an inverse-quantized value of said plurality of quantized values, incorporating the preliminary inverse-quantized value with a small difference respect to said signal other than said plurality of quantized values into a set of said plurality of inverse-quantized values.

4. A video encoding method of encoding a quantized value vector, employing a video inverse-quantization method of deriving an inverse-quantized image vector from a quantized value vector of a currently processing image vector, of a processor programmed to perform the video encoding method, wherein said video inverse-quantization method comprises:

calculating elements of an initial inverse-quantized image vector of said currently processing image vector element-by-element by employing an element of another image vector having a correlation with said currently processing image vector, and an element of said quantized value vector; and calculating, as said inverse-quantized image vector, a preliminary inverse-quantized image vector that attains a minimum total variation norm and lies in a vector space determined by another image vector having a correlation with said currently processing image vector and a conditional probability density function corresponding to said correlation by employing said initial inverse-quantized image vector calculated as an initial inverse-quantized image vector.

5. A video decoding method of decoding a quantized value vector, employing a video inverse-quantization method of deriving an inverse-quantized image vector from a quantized value vector of a currently processing image vector, of a processor programmed to perform the video decoding method, wherein said video inverse quantization method comprises:

calculating elements of an initial inverse-quantized image vector of said currently processing image vector element-by-element by employing an element of another image vector having a correlation with said currently processing image vector, and an element of said quantized value vector; and calculating, as said inverse-quantized image vector, a preliminary inverse-quantized image vector that attains_a minimum total variation norm and lies in a vector space determined by another image vector having a correlation with said currently processing image vector and a conditional probability density function corresponding to said correlation by employing said initial inverse-quantized image vector calculated as an initial inverse-quantized image vector.

6. An inverse quantization device for inverse-quantizing a plurality of quantized values as a set, and obtaining a set of a plurality of inverse-quantized values, comprising:
   a processor; and
   a storage, having stored thereon a program that, when executed by the processor, instructs the processor to implement:
       a first calculator configured to calculate a preliminary inverse-quantized value of each quantized value of said plurality of quantized values element-by-element by employing said plurality of quantized values;
   and a second calculator configured to obtain a potential range of an inverse-quantized values for each quantized value by employing said plurality of quantized values, a signal other than said quantized value and a conditional probability density function, and obtain a set of the preliminary inverse-quantized values that attains a minimum total variation norm and lies in a plurality of said potential ranges of inverse-quantized values by employing said set of the preliminary inverse-quantized values calculated element-by-element as initial inverse-quantized values, wherein said plurality of quantized values are calculated by quantizing a plurality of elements x, said signal other than said quantized value is the signal y that has a correlation with said plurality of elements x, and said conditional probability density function is the conditional probability density function $f_{x|y}$ that corresponds to said correlation.

7. The inverse quantization device according to claim 6, wherein said decoder comprises:
   the first calculator configured to calculates the preliminary inverse-quantized value of each quantized value of said plurality of quantized values element-by-element by employing said plurality of quantized values and a signal other than said quantized value, and
   the first calculator configured to obtains a potential range of an inverse-quantized value for each quantized value by employing said plurality of quantized values and signal other than said quantized value, and obtains a set of the preliminary inverse-quantized values that attains the minimum total variation norm and lies in a plurality of said potential ranges of inverse-quantized values by employing said preliminary inverse-quantized values calculated element-by-element as initial inverse-quantized values.

8. The inverse quantization device according to claim 6, wherein when said signal other than said plurality of quantized values lies in said potential range of an inverse-quantized value of said plurality of quantized values, said decoder incorporates the preliminary inverse-quantized value with a small difference respect to said signal other than said plurality of quantized values into a set of said plurality of inverse-quantized values.

9. A video encoding device for encoding a quantized value vector, comprising a video inverse quantization device for deriving an inverse-quantized image vector from a quantized value vector of a currently processing image vector, wherein said video inverse-quantization device comprises:
   a processor; and
   a storage, having stored thereon a program that, when execute by the processor, instructs the processor to implement:
       an image vector element calculator configured to calculate elements of an initial inverse-quantized image vector of said currently processing image vector element-by-element by employing an element of another image vector having a correlation with said currently processing image vector, and an element of said quantized value vector; and
       an image vector calculator configured to calculate, as said inverse-quantized image vector, a preliminary inverse-quantized image vector that attains a minimum total variation norm and lies a vector space determined by a conditional probability density function and another image vector having a correlation with said currently processing image vector and a conditional probability density function corresponding to said correlation by employing said initial inverse-quantized image vector calculated by said image vector element calculator as an initial inverse-quantized image vector.

10. A video decoding device for decoding a quantized value vector, comprising a video inverse quantization device for deriving an inverse-quantized image vector from a quantized value vector of a currently processing image vector, wherein said video inverse-quantization device comprises:
   a processor; and a storage, having stored thereon a program that, when executed by the processor, instructs the processor to implement: an image vector element calculator configured to calculate elements of an initial inverse-quantized image vector of said currently processing image vector element-by-element by employing an element of another image vector having a correlation with said currently processing image vector, and an element of said quantized value vector; and
   an image vector calculator configured to calculate, as said inverse-quantized image vector, a preliminary inverse-quantized image vector that attains a minimum total variation norm and lies in a vector space determined by another image vector having a correlation with said currently processing image vector and a conditional probability density function corresponding to said correlation by employing said initial inverse-quantized image vector calculated by said image vector element calculator as an initial inverse-quantized image vector.

11. non-transitory computer readable medium storing a program that, when executed on computer for inverse-quantizing a plurality of quantized values as a set, and obtaining a set of a plurality of inverse-quantized values, cause said computer to:
   a process of calculating a preliminary inverse-quantized value of each quantized value of said plurality of quantized values element-by-element by employing said plurality of quantized values; and
   a process of obtaining a potential range of an inverse-quantized value for each quantized value by employing said plurality of quantized values, a signal other than said quantized value and a conditional probability density function, and obtaining a set of the preliminary inverse-quantized values that attains a minimum total variation norm and lies in a plurality of said potential ranges of inverse-quantized values by employing said set of the preliminary inverse-quantized values calculated element-by-element as initial inverse-quantized value, wherein said plurality of quantized values are calculated by quantizing a plurality of elements x, said signal other than said quantized value is the signal y that has a correlation with said plurality of elements x, and said conditional probability density function $f_{x|y}$ corresponds to said correlation.

* * * * *